United States Patent
Mowles

(10) Patent No.: US 6,541,695 B1
(45) Date of Patent: *Apr. 1, 2003

(54) HIGH EFFICIENCY SOLAR PHOTOVOLTAIC CELLS PRODUCED WITH INEXPENSIVE MATERIALS BY PROCESSES SUITABLE FOR LARGE VOLUME PRODUCTION

(76) Inventor: Thomas Mowles, 2727 Midtown Ct., #23, Palo Alto, CA (US) 94304

( * ) Notice: Subject to any disclaimer, the term of this patent is extended or adjusted under 35 U.S.C. 154(b) by 0 days.

This patent is subject to a terminal disclaimer.

(21) Appl. No.: 07/947,863

(22) Filed: Sep. 21, 1992

(51) Int. Cl.⁷ ................. H01L 31/06; H01L 31/0392
(52) U.S. Cl. ................. 136/252; 136/265; 257/431; 257/613; 437/5
(58) Field of Search ................. 136/252, 265; 257/431, 613

(56) References Cited

U.S. PATENT DOCUMENTS 3,230,044 A   1/1966   Hegyi ................. 423/299
4,692,203 A * 9/1987   Betz et al. ................. 117/109

OTHER PUBLICATIONS

K. Ito et al, *Jpn.J. Appl. Phys.*, vol. 20 (1981), Supplement 20–2, pp 109–112.*
A. Catalano, *Thin Solid Films*, vol. 83, pp L141–L145 (1981).*
J. Lang, *J. Electrochem. Soc.*, vol. 130, No. 3, pp 725–727 (1983).
T. Suda, *J. Crystal Growth*, vol. 99, pp 625–629 (1990).
M. Rubenstein et al, *J. Appl. Phys.*, vol. 41, No. 4, pp1777–1786 (1970).
T.A. Mowles, Master's Thesis, Lawrence Berkely Lab, Univ of Cal. (LBL 7661).
T.A. Mowles, Ph. D. Thesis, Mat'ls Science Dept, Univ of CA, Berkeley (Nov. 1981).
M.E. Fleet et al, *Acta Cryst.*, vol. C40, pp 1778–1779 (1984).
M.E. Fleet et al, *J. Mater. Res.*, vol. 1, No. 1, Jan./Feb. 1986, pp 187–192.
R.S. Berg et al, *Solid State Comm.*, vol. 46, No. 2, pp 101–104 (1983).
V. Samuel et al, *J. Mater. Res.*, vol. 4, No. 1, Jan./Feb. 1989, pp 185–188.
V.A. Demis et al, *Cryst. Res. Technol.* vol. 24, No. 6, pp 585–590 (1989).
Ch. Kloc et al, *J. Crystal Growth*, vol. 106, pp 635–642 (1990).
S. Fletcher et al, *Mat. Res. Bull.* vol. 22, pp 543–549 (1987).
T. Gibinski et al, *Kristall und Technite*, vol. 9, No. 2, (1974), pp 161–163.
H. Von Kanel et al, *Hydrogen Energy Progress V*, pp 969–980 (Date Unknown).

* cited by examiner

Primary Examiner—Aaron Weisstuch
(74) Attorney, Agent, or Firm—John A Frazzini

(57) ABSTRACT

A thin film, photovoltaic, solar energy conversion device comprising: a thin-film, photovoltaic layer; a transparent electrical conducting layer in contact with said photovoltaic layer; a back electrical conducting layer in contact with said photovoltaic layer; fabricated on a suitable substrate; said photovoltaic layer being of a material selected from the class consisting of: monoclinic zinc diphosphide (also referred to as beta zinc diphosphide and indicated by β-ZnP₂); copper diphosphide (CuP₂); magnesium tetraphosphide (MgP₄); gamma-iron tetraphosphide (γ-FeP₄) and mixed crystals formed from these four materials. A thin film fabrication process is presented that produces high efficiency, low-cost photovoltaic layers of the above-indicated class.

47 Claims, 16 Drawing Sheets

$\Delta V$ = Bandgap of Photovoltaic Material
$\Delta V'$ = Bandgap of Transparent Conductor

HIGH EFFICIENCY SOLAR PHOTOVOLTAIC CELLS PRODUCED WITH INEXPENSIVE MATERIALS BY PROCESSES SUITABLE FOR LARGE VOLUME PRODUCTION

FIELD OF THE INVENTION

This invention relates in general to photocells and the processes of their manufacture and relates more particularly to a class of materials, photocell structures compatible with these materials and associated manufacturing processes that produce high efficiency, inexpensive photocells.

CONVENTION REGARDING REFERENCE NUMERALS

In the figures, each element indicated by a reference numeral will be indicated by the same reference numeral in every figure in which that element appears. The first two digits of any 4 digit reference numerals and the first digit of any two or three digit reference numerals indicates the first figure in which its associated element is presented.

BACKGROUND OF THE INVENTION

The oil embargo of the late 1970's sensitized the world to the problem of limited petrochemicals in the world and the concentration of such chemicals in several regions around the world that are unstable economically and politically. This produced a step increase in the interest level for using renewable energy sources, such as solar power, wind power and tidal power. The recent war between the United States and Iraq has reconfirmed the need for a stable energy source that is not affected by political events around the world. In addition, the desire for clean air is so acute, that interest in nuclear power may be revived despite the well-known radiation dangers and lack of nuclear waste treatment methods. Unfortunately, the progress in developing alternate energy sources has been disappointing and has shown that the development of such technologies is very difficult.

Although there was initially a high level of hope that high efficiency, photovoltaic cells could be manufactured to produce directly from incident solar energy the large amounts of electricity utilized throughout the world, the photovoltaic cells produced up to now have been commercially viable only for special niche markets, such as: solar powered calculators for which consumers are willing to pay the additional cost to avoid the problems of battery replacement; solar powered telephones for use in areas that are remote from electrical power lines; and buildings located in regions of the country that are sunny and sufficiently remote from commercial power lines that solar power is a cost effective alternative. If solar energy is to provide a significant fraction of this country's or the world's power needs, the average cost per Watt for solar photovoltaic cells over the life of such cells must be reduced to a level that is competitive with the average cost per Watt of power from existing electrical utilities over the same period.

At the present time, the average cost per Watt of photovoltaic power, over the life of the photovoltaic cells, is more than five times the typical cost per Watt of electricity produced by present day electric power plants. It is therefore necessary to greatly reduce the cost of photovoltaic cells in order to reduce both the purchase price of a photocell array and the average cost of electricity produced by such cells over the useful life of that array. For solar electric energy to be practical for use by electrical power utilities or to be a practical alternative for use by electrical power consumers, a photocell design must be provided that: has a low material cost; has a highly efficient structure; and can be manufactured in large volumes by low-cost manufacturing processes. The design of this photocell requires an interactive analysis of materials, cell structure and fabrication processes. To produce low cost, efficient cells in the volumes needed to supply a significant fraction of the world's power needs, the manufacturing processes must provide high deposition rates and high layer uniformity over a large area photocell.

A first significant factor in the manufacturing cost of a solar photovoltaic cell is the cost of the materials needed to manufacture this cell. The cost of the material in the photosensitive, current-generating layer of the photovoltaic cell can be a significant fraction of the cost of manufacturing such photovoltaic cell. To efficiently convert incident radiation, this layer must convert most of the incident solar energy into electrical power. If the absorbance value of the photosensitive, current-generating material is small, then its thickness must be correspondingly large to absorb and convert most of the incident solar energy. Because many photosensitive, current-generating materials are relatively expensive, a significantly increased thickness of this layer can significantly increase the total cost of a photovoltaic cell utilizing that material.

Even when such low photosensitivity material is not expensive, it can still significantly increase the cost of the photovoltaic cell. The increased thickness of the photosensitive, current-generating layer increases the average pathlength that the photovoltaically generated charged species must travel to corresponding electrodes. This produces a concomitant increase in the electrical resistance of such layer, thereby decreasing power conversion efficiency. In order to avoid unduly degrading the amount of electrical power produced for a given flux of incident solar energy, the photosensitive, current-generating layer must have a high level of purity in order to have a high enough conductivity that resistive losses do not significantly degrade performance. Such increased material purity requirements can greatly increase the cost of such solar energy cells.

Much of the research and development of solar cells has been directed toward single crystal silicon photocells, because the tremendous amount of knowledge about solid-state circuits manufactured in a silicon substrate can then be applied to this problem. Silicon also has the advantage of being a non-toxic, readily available resource. However, crystalline silicon is a relatively poor solar absorber, because it is an indirect bandgap material. This means that a relatively thick crystalline layer must be utilized to absorb a significant fraction of the incident solar energy. Unfortunately, this increased thickness will degrade efficiency, because of the concomitant increase in the resistance across which the photogenerated charge carriers need to travel. This increase in resistance because of this increased thickness must be offset by a reduction in resistivity by the use of high purity, high perfection silicon layers. Such layers are very costly and therefore significantly increase the cost of single crystal silicon photocells.

These thick layers of silicon must be made by the expensive process of solidification from the melt in a single crystal boule that is then sliced to form the crystalline wafer. Approximately half of this crystal is lost during this slicing process, further increasing the cost. Even though the silicon photocells are durable and efficient, their cost is still prohibitively high for utility power. Although the conventional single crystal layer growth process can be modified to produce lower cost, polycrystalline photocells, this change in the material structure also reduces the efficiency of the resulting photocell, such that the resulting cost of electric power is still too high to compete with existing electrical utilities.

Amorphous silicon is attractive for use as the photosensitive, current-generating layer in photocells, because its high absorptivity for solar energy enables the photosensitive, current-generating layer to be extremely thin, thereby reducing the material cost of that layer and reducing the resistive losses of that layer. This amorphous silicon layer is also very insensitive to impurities. This results in a very inexpensive layer that, unfortunately, due to the nature of electricity transport in amorphous materials, has a very low efficiency.

Although the efficiency can be increased by producing several amorphous layers in a stacked arrangement, this also increases the cost enough that the resulting device is not commercially competitive. Amorphous silicon, which is actually an alloy of hydrogen and silicon, also has a more serious weakness that, when exposed to sunlight, hydrogen is gradually liberated, thereby severely degrading the efficiency of the device. The lifetime of such photocells is too short to collect enough electricity to pay for their cost. In addition, the production of this material is difficult, because, at the low substrate temperature required for the growth of this amorphous phase, the growth rate is low and the source chemicals are not fully dissociated. This significantly increases the cost of this material.

For the above reasons, it was important to search for alternative materials for use in solar photovoltaic cells. Gallium arsenide (GaAs) and aluminum gallium arsenide ($Al_xGa_{1-x}As$) have been investigated, developed and utilized for use as solar cells. These materials have been used to make the most efficient solar cells yet made. Unfortunately, the cost of these devices is more than ten times the cost of silicon devices, so that these devices are utilized only when the cost of such devices is not a significant factor. Although these devices are used for space power and high performance solar electric race cars, they are unsuitable for electric utility power. In addition, these materials contain gallium, which has limited availability and contain arsenic which is both a poison and a carcinogen. The use of this material on a scale suitable for producing a significant fraction of the electrical power needs of the U.S. or the world would create tremendous environmental problems. Indeed, the tremendous volume of photovoltaic cells that must be manufactured to provide the ability to generate a significant fraction of our energy needs, means that every choice of material in such photovoltaic cells must be evaluated as to the resulting impact on the cost of materials needed to manufacture such devices and the resulting impact on the environment of manufacturing and/or disposing of such a tremendous volume of these photovoltaic cells.

Cadmium telluride (CdTe) has been actively developed for solar electric power for many years. This material has achieved high efficiency in small area devices and research continues toward obtaining high efficiency over large areas. However, even if the junction efficiency and humidity degradation problems were solved, it would still be inadvisable to use this material for terrestrial solar electric power, because cadmium and tellurium are both dangerous environmental poisons. In addition, tellurium is a rare and expensive material. Such rare and expensive materials should only be considered for use as dopants, because any other use would make the resulting device commercially impractical and would rapidly deplete the available quantities of such materials.

Another material currently being developed for solar electric applications is copper indium diselenide ($CuInSe_2$, called CIS). Small cells of high efficiency have been made but the process used for their growth is complex, costly, nonuniform for large areas, and requires large amounts of the extremely toxic gas hydrogen selenide. Indium is an expensive and very rare chemical element, whose cost and availability have not been a problem to date, because it has been used only as a dopant. This means that only a minute amount of this material is needed in any given device, so that the total demand has not yet significantly depleted the amount of this material that is available. However, if solar electric cells using indium as a primary component were used to produce a significant fraction of the world's power needs, the cost would rise rapidly as the supply of this rare element became depleted. Another problem with these solar photovoltaic cells is that selenium is both relatively rare and toxic and its widespread use would be inadvisable.

It is therefore necessary to locate materials, for use in the manufacture of solar photovoltaic cells, that are abundantly available so that the cost will be low and the available amount of such material will not be significantly depleted, even at the tremendous volume of solar photovoltaic cells needed to provide a significant fraction of our power needs. These materials should also be nontoxic, so that these volumes will not pollute the environment. It is also important that these materials be readily available from many sources so that there is no possibility of a cartel controlling such resources and producing problems similar to the oil embargo of the 1970's. These materials must be capable of low cost deposition on large area substrates with high uniformity.

SUMMARY OF THE INVENTION

In accordance with the illustrated preferred embodiment, new materials are identified as being appropriate for use in the manufacture of solar photovoltaic cells that are sufficiently efficient, inexpensive and durable that they can competitively supply a significant fraction of the world's electric power needs. These materials were identified by considering the following factors. The chemical elements from which the material is formed must all be inexpensive and abundantly available, so that the huge volumes required will not deplete the resources of such materials or increase the cost of such materials to levels that would prohibit widespread use of these devices. These elements should be available throughout the world, so that a cartel cannot interfere with reasonable, inexpensive access to these materials.

These elements must form a semiconductor material, so that a photovoltaic diode device structure can be formed to convert sunlight to electricity. This semiconducting material must absorb sunlight efficiently in a very thin layer, so that only a small amount of photovoltaic material is required for a large area device and so that the photogenerated carriers are required to travel only a short distance before being collected by the diode junction. This latter benefit enables the use of lower cost, lower purity materials than would be necessary in a thick photosensitive, current-generating layer to keep recombination losses low, thereby reducing material costs of the photocell. The material should also be able to be deposited in a thin film form using processes similar to integrated circuit techniques now in use, so that the expertise in these fields and the manufacturing chemicals, equipment and designs can be applied to the manufacture of these solar cells.

Semiconductors have a threshold energy for the absorption of incident photons, known as the "bandgap", which is characteristic of that semiconducting material. A photon that has an energy higher than the bandgap will be strongly absorbed, whereas a photon that has an energy lower than the bandgap will not be strongly absorbed. Therefore, the photovoltaic semiconductor must have a bandgap that is matched to the incident solar spectrum. If the bandgap is too high, then fewer of the available photons will be absorbed, which reduces the device efficiency. If the bandgap is too low, then the voltage of the device (which is proportional to the bandgap) will be low, which reduces the device efficiency.

The spectral distribution of the solar energy incident on the earth outside of the earth's atmosphere differs somewhat from the spectral distribution of the solar energy at the earth's surface. This difference arises because of the absorbance and reflectance of the earth's atmosphere. Therefore, the optimum bandgap of the photovoltaic material differs according to whether the solar cells are to be utilized above the earth's atmosphere or at the earth's surface. As a practical matter, these two distributions are sufficiently similar that there is negligible impact on the choices of materials to be utilized for the photovoltaic layer. Several independent studies have shown that efficient solar cells can be made from a semiconductor that has a bandgap between 1 and 2 electron volts, with the optimum being approximately 1.5 electron volts.

Semiconductors which have a sharp transition in absorption at the bandgap are known as "direct" bandgap materials, and those which have more of a slope at the transitions are known as "indirect" bandgap materials. The ideal photovoltaic materials have a "direct" bandgap, because such materials absorb incident light in a very thin layer (less than one micrometer thick), whereas an "indirect" bandgap material requires a thick layer (over one hundred microns thick) to absorb the same fraction of incident light. Devices based upon a thin layer of direct bandgap material are less expensive, because less material is needed and the photovoltaic layer can be vapor deposited as a thin film.

It is difficult to deposit low cost, high quality, thick layers from a vapor, so "indirect" bandgap materials, such as silicon, are manufactured by solidification from a liquid melt and then sawed into wafers for use as devices. This melt growth process is very expensive and wasteful due to loss of material during cutting. In addition, the resulting discrete devices (typically less than 150 millimeters across) require additional costly assembly into larger modules for final installation. The use of thin films also reduces the distance that the generated carriers must traverse before being collected. This reduces the mobility and lifetime requirements for the current carriers in this layer, which enables high efficiency devices to be formed from a relatively lower quality layer. This further reduces the cost of high efficiency devices. However, indirect materials have the advantage of longer lifetimes of generated carriers that can produce highly efficient devices if the purity and perfection of the thick film can be obtained. Therefore, while indirect bandgap materials are less likely candidates, they should also be considered if a low cost of the thick layer is possible.

To be commercially viable for generating a significant fraction of the electrical power needs of the United States at this time, the resulting photovoltaic cell should maintain an efficiency of at least 15% for a period of greater than 30 years and must be made of materials selected such that the installation of more than 20 billion square meters of cells in less than 20 years will not significantly deplete the supply or inflate the cost of these materials. The total cost of these cells should be on the order of, or less than, $50/m$^2$, so that the average cost of electricity from these solar photovoltaic cells over the lifetime of these cells is comparable to the projected cost of generating that electricity from conventional sources.

The following five materials satisfy all of the these requirements and therefore will produce photovoltaic cells having high efficiency at greatly reduced cost: monoclinic zinc diphosphide (also referred to as beta zinc diphosphide and indicated by $\beta$-$ZnP_2$); copper diphosphide ($CuP_2$); magnesium tetraphosphide ($MgP_4$); $\gamma$-iron tetraphosphide ($\gamma$-$FeP_4$) and mixed crystals formed from these four materials.

Large-scale solar photovoltaic cells will typically be manufactured as arrays of smaller cells. In order to produce a significant fraction of our national electric power needs (on the order of 3,000 billion kWh/year), the total area of these cells must be on the order of 15,000 square kilometers. In order to manufacture such a tremendous area of photovoltaic cells, it is advantageous to utilize a reactor design that can manufacture sheets of photovoltaic material having a width on the order of a meter or more. Processing sheets of this size requires processes that produce highly uniform thin films over this entire width. And this process must operate near, or below, atmospheric pressure. If the pressure were significantly above one atmosphere, the walls of the equipment used for the process would have to be very thick and heavy, the inherent difficulty and danger in such a process would increase the effective cost of the cells produced.

All of the proposed materials are compounds that contain more atoms of phosphorus than atoms of the metal species. They are all known to decompose to compounds having less phosphorus content, unless they are maintained in an atmosphere of phosphorus gas whenever they are exposed during heating. These materials must be deposited on a heated substrate during deposition of a thin film in order to form a layer having the properties that approach those of single crystals, as required for high efficiency solar devices. It is commonly believed that crystals of these materials must be grown at pressures from 3–10 atmospheres. The existing synthesis literature reports very high pressure crystal growth under phosphorus gas overpressures. These pressures are prohibitive for the growth of large area thin films using conventional atmospheric pressure, or vacuum, equipment.

The existing literature on the growth of $\beta$-$ZnP_2$ crystals shows growth occurring at very high pressures (on the order of several atmospheres) and a large excess of phosphorus to produce zinc diphosphide instead of sesquizinc phosphide ($Zn_3P_2$) and therefore indicates that large area substrates cannot be coated with $ZnP_2$. However, a detailed analysis of the thermodynamics of the growth of $ZnP_2$ and the conditions of its decomposition to $Zn_3P_2$ has shown that in the temperature range required by the proposed manufacturing process for $ZnP_2$ thin films there exists a region of obtainable partial pressures that enables $ZnP_2$, with nearly single crystal properties, to be manufactured at, or below, atmospheric pressure. This enables the production of potentially highly efficient solar cells based upon $ZnP_2$ using conventional process equipment technology.

Analysis of the available literature on the other materials ($CuP_2$, $MgP_4$, and $FeP_4$) has shown (where the data exists) that they too can be grown with near single crystal properties at conditions obtainable with modification to the conventional process equipment technology.

Thin films of these materials must be produced by some means. Solidification of the liquid phase is not possible due to the high pressures to prevent decomposition of the melt. Vacuum evaporation techniques, while possible, are not useful because of the nonuniformity of the deposit if done over large areas or for long times. Chemical vapor deposition (CVD) is the preferred method of depositing thin films of any of these materials. CVD has the advantages of producing high purity, highly uniform thin films over very large areas with the ability to conform to surface irregularities, allows very high deposition rates and efficient abrupt junctions to be formed. CVD equipment is comparatively inexpensive and can be easily scaled to use very large substrates, especially if an atmospheric pressure process is used. CVD is particularly suited for adaptation to the continuous growth processes preferred for the high throughput required to mass-produce the large amounts of cells needed for solar electric utility power. The cost of layers produced by CVD can be made sufficiently low by the use of low cost source species, a process for growth near equilibrium conditions where a near stoichiometric gas composition can be used (reducing waste of source chemicals) and by proper design of the gas flow system (allowing efficient utilization of the source chemicals).

The CVD method requires a vapor transport species that has a sufficiently high vapor pressure to transport the elements to the substrate without condensing on the walls of the growth apparatus. The metallic elements have transport species (in particular, organometallic molecules) that are useful for this process and are commercially available in high purity. The cost of these species, if manufactured in the large volumes expected to be needed, would be low enough to meet the cost criteria on the resulting solar device.

A new phosphorus source has been identified that significantly reduces the cost of manufacture and yields the high purity layers required by all five above-identified photovoltaic materials. This new phosphorus vapor transport species is liquid white phosphorus and is used in a reactor having walls that are heated to prevent condensation without decomposition. White phosphorus is the form of phosphorus that results from smelting phosphate ores, that is purified to make high purity red phosphorus, and that is used to synthesize organophosphorus compounds. It is the cheapest and highest purity form of phosphorus and can be used directly for CVD in an appropriately designed reactor.

Selection of the phosphorus transport species is a problem for conventional CVD processes. The most commonly utilized gaseous phosphorus source for use in CVD is phosphine ($PH_3$). Unfortunately, it is extremely toxic (one breath at 50 ppm is fatal half of the time) so the entire system must be absolutely leak-tight, all process areas must be fail-safe ventilated and monitored with phosphine detectors, thereby increasing the downtime, facility and maintenance costs. Since it is so toxic, few manufacturers will supply it and the cost of phosphine is very high. In addition, phosphine does not dissociate completely at substrate temperatures as high as 650° C. and much of it goes through the reactor without reaction. This increases the effective cost of the process and produces a difficult exhaust treatment and environmental safety problem. This also precludes the use of phosphine in low substrate temperature processes. Although trimethylphosphine and triethylphosphine can be utilized as the phosphorus source, these two species are also quite toxic and they allow incorporation of carbon into the thin films. Bisphosphinoethane and tertiary butyl phosphine have recently been introduced as commercially available phosphorus sources, but these are about fifteen times as expensive as phosphine and therefore contribute significantly to the manufacturing cost of the photovoltaic cells. Research systems designed to produce phosphine in-situ by reacting plasma produced atomic hydrogen with heated red phosphorus have not proved useful in a production enviromnent due to difficulty in controlling the source reaction for uniform repeatable processes.

All of the proposed photovoltaic materials have high solar absorption and low bulk density and, thus, are suitable for the manufacture of efficient lightweight solar cells for use on solar powered airplanes, lighter-than-air craft, satellites and other applications where it is important to have lightweight solar power. Because the weight and cost of the substrate of a solar cell is the dominant fraction of the total weight and total material cost, it is important to use lightweight, low cost substrate materials. Plastic substrate have the advantage of being both light weight and low cost. In order to utilize this class of substrates, the process for depositing the solar cell materials should be at a low enough temperature to be compatible with this choice of substrate. This can be achieved by use of plasma enhancement to the proposed chemical vapor deposition process which would be set to operate at a temperature at, or below, 375 degrees Centigrade. The use of a plasma to excite the reactant species and carrier gas enables the production of high quality films at a lower temperature because part of the energy required for the deposition process is supplied by these excited species as they arrive at the substrate. This low temperature capability enables this class of substrate materials (plastics) to be utilized for the fabrication of solar photovoltaic cells.

In order to produce photovoltaic cells of the highest possible collection efficiency, the purity of the photovoltaic layer should be as high as possible. The use of a plasma to dissociate hydrogen gas into hydrogen atoms can be utilized to reduce the incorporation of carbon (from the organometallic species used to vapor transport the metal species) into the photovoltaic layer by reacting with, and removing, any carbon that becomes exposed during the growth process. This is particularly critical for devices based upon iron phosphide, or mixed crystals containing iron, because the tendency for iron to form a very stable carbide. The plasma can be used to enhance the purity of the deposited thin film and thus the efficiency of the photovoltaic device fabricated from the film.

It has been observed that the surface of $\beta$-$ZnP_2$ crystal oxidize slowly on air at room temperature over a long time and this decomposition is accelerated by temperature and in moist environments. This process would occur at a significant rate in a solar cell of standard design (exposed or protected by a thin antireflection coating) under conditions of its normal operation. In particular structures must be used to protect the critical diode junction against such decomposition. This protection is achieved by using a homojunction device where the junction is slightly below the surface of the layer and by the use of a passivating layer that prevents the transport of atmospheric oxygen and moisture to the surface or the transport of the initial decomposition products from the surface, thereby stopping the reaction before the junction region is damaged. By this means, a practical cell lifetime of over 30 years can be achieved. In order for a solar cell having this passivation layer to also have high efficiency it is necessary that the passivating layer also has high electrical conductivity and high transparency to the solar spectrum. There are several materials able to function in this multiple role. A unique and particularly attractive one for this purpose is zinc phosphate which has the required properties, is known to prevent decomposition of $ZnP_2$, and can be produce in the same reactor utilized to produce the $ZnP_2$ layer (possibly using the same source species).

DESCRIPTION OF THE PREFFERED EMBODIMENT

Figure 1:
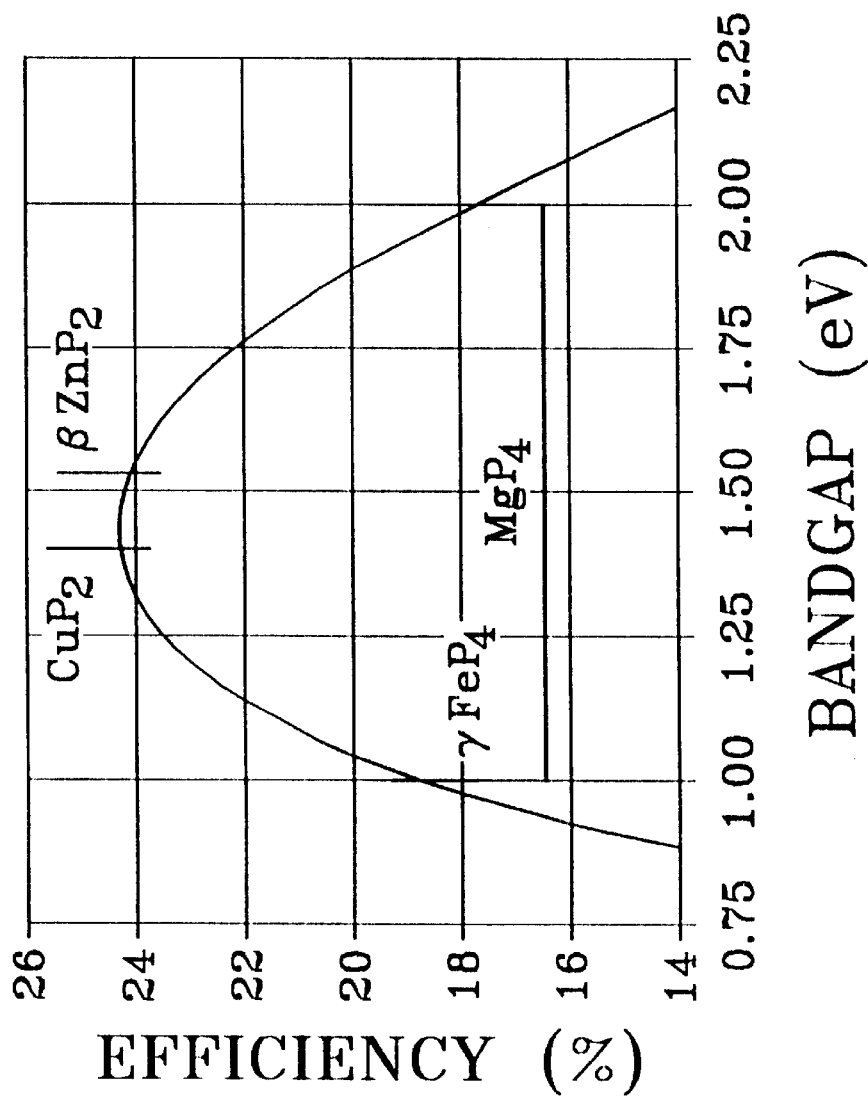
FIG. 1 illustrates the maximum efficiency of a photocell as a function of the bandgap of its photovoltaic material.

FIG. 1 illustrates the maximum efficiency of a photocell as a function of the bandgap of its photovoltaic material. This curve is based upon both the current obtained from the absorbed portion of the incident solar spectrum and the voltage developed by the cell and is peaked at about 1.45 electron Volts (eV). As seen in the figure, β-ZnP$_2$ and CuP$_2$ are each so close to this peak that the efficiency of each of these two materials is substantially optimal. CuP$_2$ has a unique advantage by having both an indirect bandgap of 1.4 eV which offers long lifetimes of the generated carriers and a direct bandgap value (which is always higher) at only 1.5 eV which would give the steep absorption edge necessary for absorption in thin layer (characteristic of direct absorption). In general, neglecting the details of the transport properties, any material having a bandgap in the range from 1 to 2 eV is a strong candidate for use in photovoltaic cells to be used for solar electric power generation. The bandgap value of 1 eV for gamma FeP$_4$ would indicate its usefulness in a solar photovoltaic. Although the bandgap of MgP$_4$ has not been measured, its bandgap can be approximately inferred from the facts that (1) it is black and thus its bandgap could not be greater than 2 eV (which would appear "red") or below 1 Ev (which would appear "grey" or "silvery black"); and (2) it is isostructural with cadmium tetraphosphide (CdP$_4$) which is known to have a direct bandgap near 1 eV. Because MgP$_4$ can be expected to be more ionic than CdP$_4$, its bandgap can be expected to be both direct and to have a higher value closer to the optimal bandgap.

β-ZINC DIPHOSPHIDE EMBODIMENTS

Figure 2A:
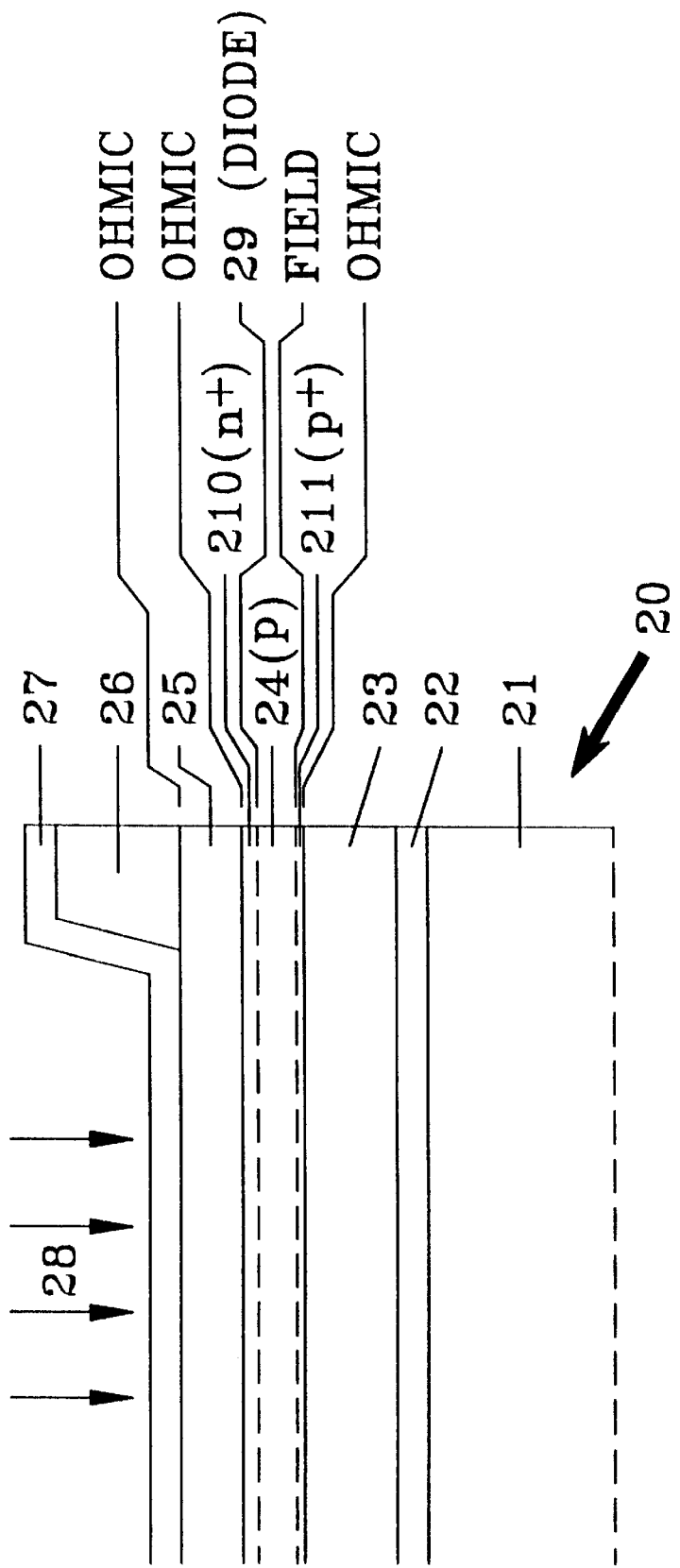
FIG. 2A illustrates a structure of a photovoltaic cell 20 utilizing β-ZnP$_2$ as the photovoltaic layer.

FIG. 2A illustrates a structure of a photovoltaic cell 20 utilizing β-ZnP$_2$ as the photovoltaic layer. This cell includes a substrate 21, an insulating layer 22, a back conductor 23, a photovoltaic layer 24, a transparent conductor 25, a grid conductor 26 and an antireflection coating layer 27. This photovoltaic cell exhibits an improved (lower) cost and cost-per-watt compared to existing photovoltaic cells. Although it is designed primarily for conversion of a solar energy flux into electrical power, it could also be utilized in other applications that convert light of an energy absorbed by the β-ZnP$_2$ into an electrical output. Incident light 28 is transmitted through the antireflection coating 27 and the transparent conductor 25 to the photovoltaic layer 24, where the light is strongly absorbed by conversion into electron-hole pairs near the front surface of this layer and near a pn junction 29 within the diffusion length of these carriers. This junction is formed between a highly doped n-type (n+) region 210 and a lightly doped, or undoped (intrinsic), p-type photovoltaic layer 24. This junction collects the electrons generated in the p-region and the holes generated in the n+region to provide a current between the grid conductor 26 and the back conductor 23. There is a highly doped p-type (p+) region 211 near the back conductor 23 that forms an abrupt step in the p-type concentration relative to the p-type concentration in the photovoltaic layer 24. This concentration step intercepts any photogenerated electrons traveling toward the back conductor 23 and reflects them back toward the collecting junction. This structure, known as a "back surface field", greatly increases the efficiency of a thin film device by preventing the loss of photogenerated electrons by recombination at the back conductor 23.

Following is a description of the function of these layers and the factors involved in selecting appropriate materials and the thicknesses of each of these layers. The n+region 210 creates the collection junction 29 required for the photovoltaic effect in the photovoltaic layer 24. The transparent conductor 25 must form a low resistance ohmic contact to the n+region 210. The back conductor 23 must form a low resistance ohmic contact to the p+region 211.

Substrate 21 provides the mechanical support structure required during fabrication and use of this photovoltaic device. This material must be strong enough to provide this necessary support and should be sufficiently stable under the subsequent process conditions that is it mechanical properties are not lost during such process steps. Because of the need for low cost photovoltaic cells, this material should be as inexpensive and as thin as possible while providing these properties. For most applications it is desirable that this layer be flexible. Because the anticipated need for solar electricity is incredibly large, the high production throughput requires that the substrate should be able to be manufactured in the form of wide, thin sheets (on the order of a meter wide and perhaps as thin as 40–100 microns) that can be stored as a continuous roll from which this material can be translated through the processing equipment for the fabrication of the photovoltaic cells. It is advantageous that this material be malleable, so that such rolls can be inexpensively manufactured. The preferred choice of this material is an iron alloy such as stainless steel because of the low cost, high current production volumes and the commercial availability of such rolls. Other materials would include copper alloys (brasses and bronzes), aluminum alloys and molybdenum alloys. For applications where extreme flexibility or light weight are required, the preferred choice of the substrate would be films of high temperature stable plastics such as polyimides. For applications requiring a transparent substrates various glasses could be used though they would be used as sheets rather than as a single roll.

The insulating layer 22 is used to electrically isolate the device from the substrate 21 if the substrate is electrically conducting (such as a metal) and if it is desired to make a series contact between cells manufactured on the same substrate. It is not needed if a plastic or ceramic substrate is used, or if a single photovoltaic cell will cover the entire metallic substrate area and if it is desired to contact this single cell from the back side. When this layer is used, it must have negligible electrical conductivity. It must be compatible with the substrate material such that either it can be formed by deposition on the substrate, or by conversion of the surface of the substrate by some process, such that it provides an intimate bond to the substrate without any cracks or pin holes in the insulating layer. It must be thermally stable during subsequent process steps and be chemically stable during deposition and possible etching of the back conductor 23. The preferred choice of this layer is silicon dioxide due to its low cost, availability of source chemicals and advance technology of its deposition. There are many other alternate materials including oxides and phosphates of the potential substrate metals. The layer need only be sufficiently thick enough to be electrically insulating and pin-hole free. This is typically 500–5000 angstroms.

The back conductor 23 provides an electrically conductive path parallel to the layers and out to the edge of the cell where it can be electrically contacted by wires, or other means, to provide power external to the cell. Therefore, it must have negligible electrical resistance, be compatible with the insulating layer material (i.e., low diffusivity into, and low reactivity with, the insulator), be thermally stable during subsequent processing, be chemically stable with respect to the material of photovoltaic layer 24 and the conditions of deposition of that layer, and it must form a low resistance ohmic contact to the photovoltaic layer 24. It should also be etchable to allow isolation of one cell from the another if more than one cell is to be manufactured on the same substrate and the unetched back conductor must be stable during the etching process. It must also form a low resistance ohmic contact with an external conductor with which it will be brought into intimate contact. Since this layer is one of the thickest active layers in the cell (excluding the substrate 21), it cost should be as low as possible while providing the required electrical conductivity. The preferred choice is pure copper but alternatives would be copper alloys (particularly the function of the back conductor 23 was integrated with the function of the substrate 21), aluminum (particularly for lightweight applications) or aluminum alloys (particularly when integrated with the substrate function for lightweight applications) or even silver (for application where the electrical conduction is more important than cost). It may be necessary to cover the back conductor with a thin layer of another material to provide the required ohmic contact to the photovoltaic layer. Transition metals that form phosphides with metallic conductivity would be useful for this purpose. These would include titanium, chromium, molybdenum, iron, copper and nickel. The thickness of this layer depends on the size of the cell from which the current in transported with a typical thickness being 1–10 microns.

The use of copper for the back conductor has special advantages unique to this material. It has very high electrical conductivity, is readily available in high purity at a reasonable price, and is soft and malleable when highly pure (oxygen free). It forms a low resistance ohmic contact to $ZnP_2$ by virtue of its ability to dope the $ZnP_2$ p-type degenerating $ZnP_2$ to metallic conductivity at the interface between the two materials. It can also form a lower phosphide $Cu_3P$ which is metallic so that the formation of an intermetallic compound during the growth of the $ZnP_2$ layer will help to form the ohmic contact. Since copper is a p-type dopant in $ZnP_2$, it can be used to form the p+ layer 211 by controlled outdiffusion from the substrate during growth of the $ZnP_2$ layer integrating the process of back surface field formation with photovoltaic layer growth, simplifying the process and reducing cost.

As indicated above, the photovoltaic layer 24 is beta zinc diphosphide because this low cost material efficiently absorbs the solar spectrum, efficiently transports the photogenerated carriers and can be fabricated with the abrupt p/n and p/p+ junctions needed for an efficient photovoltaic device. The critical p/n diode junction 29 can be formed as a homojunction by a doping transition within the layer during the layer growth or by diffusion from the surface after the layer growth is completed. Conventional dopants such as aluminum, gallium, indium, boron, tin, germanium, sulfur, selenium or tellurium can be used for the n-type dopant with gallium being preferred due to its commercial availability and lack of tendency to form either oxides or carbides. Unconventional dopants such as copper and lithium can be used for the p-type dopant with copper being preferred for its lack of mobility within the layer. The carrier concentration of undoped (intrinsic) $\beta$-$ZnP_2$ can be adjusted from its normal slight p-type conduction to strongly p-type by shifting the stoichiometry of the layer to the P-rich condition by the use of phosphorus enriching, or vacuum (zinc depleting), process or by adjusting the gas phase composition toward a large excess of phosphorus during growth of the layer. Use of zinc treatment after growth or growth from a gas phase composition that is relatively rich in zinc will shift the layer stoichiometry toward the Zn-rich condition reducing the p-type conductivity and even converting the layer to slightly n-type. The use of extrinsic dopants is preferred for better control of carrier concentration. The high purity source chemicals to produce this layer are available at a relatively low cost in large quantities from several independent suppliers. The subsequent processing conditions and the materials selected for adjacent layers must be compatible with this layer. This layer must be thick enough to absorb the incident sunlight and to fabricate separated junctions without the dopant diffusion along the crystallite boundaries extending between them. This thickness will be typically 1–3 microns.

The transparent conducting layer 25 must transmit sunlight without significant absorption and must have the highest possible electrical conductivity so that the electrical current generated in the photovoltaic layer 24 has a low resistance path to the grid conductor 26. It must bond intimately to the photovoltaic layer, must form a low resistance contact to the n+ region 210, must form a low resistance ohmic contact to the grid conductor, and must be deposited by a method that is compatible photovoltaic layer which does not effect the properties of the diode junction 29 in any way. It must be thermally and chemically stable during the processes that fabricate the grid conductor. In order to produce a photocell with an extended lifetime, the transparent conductor should form a continuous layer (no holes or cracks), be atmospherically stable chemically and photochemically and be resistant to mechanical damage. It must not be permeable to any atmospheric species that are harmful to the photovoltaic layer. The thickness of this layer is typically 1–3 microns.

The preferred material for the transparent conducting layer 25 is zinc phosphate which is easily formed on the zinc diphosphide photovoltaic layer using similar equipment and, possibly, identical chemical sources. It is chemically similar to, compatible with, and effective for passivation of $ZnP_2$. The zinc phosphate must be doped strongly n-type (n+) using conventional dopants such as aluminum, gallium and indium. Since these dopants are compatible with the n+ layer 210 in $ZnP_2$, this layer can be used as used in a integrated process to form the diode junction 29 in the photovoltaic layer 24 by controlled diffusion of the dopant from the transparent conducting layer during or following its deposition. Alternate choices of material for this layer will be zinc oxide (which is compatible, well known, and inexpensive), tin oxide (compatible, well known, though slightly more expensive), antimony tin oxide, doped aluminum phosphate, and indium tin oxide (where performance is more important than either cost or availability. Boron phosphide is another possible alternative because of compatibility with $ZnP_2$ and its growth process, high conductivity when nonstoichiometric (P-rich), and it extreme hardness and chemical inertness.

The grid conductor 26 conducts current from the photovoltaic cell to a location that can be contacted to an external load or connected to another photovoltaic cell of similar structure. This material must be highly electrically conductive. This material must form a low resistance ohmic contact to the transparent conducting layer 25. This layer is patterned on the surface of the photovoltaic cell to provide an array of openings through which incident light 28 can reach the photovoltaic layer 24 and to leave a grid of conductive material that can transport current from the edges of the regions of the photovoltaic layer that are exposed to light, to a common current output. The exposed regions are referred to as "active regions", because current is generated only in such regions. The active regions are typically at least 90% of the surface area of the photovoltaic cell. The pattern, width, thickness and spacing of the grid lines are a function of the conductivity of the material in these grid lines and the conductivity of the transparent conducting layer 25. The thickness of the grid lines is 5–10 microns using a highly conductive material but could be 100 times this if conductive solders are used.

The material for this layer must be formable into a continuous conductive pattern, should make an intimate bond with, must form a low resistance ohmic contact to, and be chemically compatible with the transparent conductor. This material must also be stable in the environment. The preferred material is aluminum. Other choices include copper, copper alloys, and solder alloys of zinc, lead and tin. Additional layer or layers can be included between the grid conductor and the transparent conductor for improved chemical compatibility, mechanical adhesion and/or electrical contact. One or more layers may be required on top of this layers to protect it from mechanical damage and atmospheric chemical attack.

The antireflection coating layer 27 reduces the fraction of incident light 28 that is reflected by the surface of the photovoltaic cell and provided additional protection of the other layers from mechanical damage and chemical attack by the environment. Its optical properties and thickness are therefore selected to prevent significant reflection from the photovoltaic cell, its mechanical properties are selected to optimize its protective functions and lifetime, and its chemical properties are selected to ensure chemical compatibility with the transparent conductor and the conductive grid. The preferred material is magnesium fluoride. Other choices include silicon monoxide, silicon nitride, silicon dioxide, titanium dioxide, aluminum oxide, phosphates of aluminum and boron, and boron phosphide. This coating can be a single layer but will often be an optical stack to optimize its antireflection property. This coating can also have a variable index of refraction with thickness. The thickness of a single layer quarter-wavelength antireflection coating will be 0.2 microns.

FIGS. 2B–2J illustrate alternate structural embodiments of the photovoltaic cell of FIG. 2A.

Figure 2B:
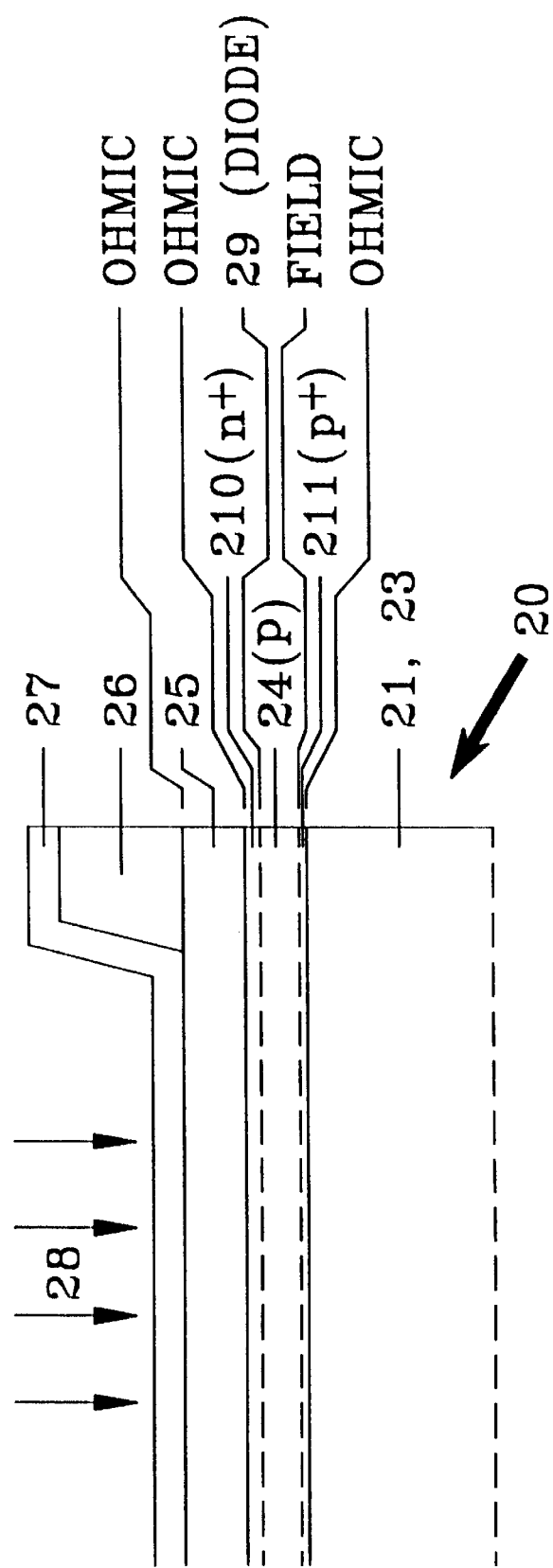
FIGS. 2B–2J illustrate alternate structural embodiments of the photovoltaic cell of FIG. 2A.

In FIG. 2B, the substrate 21, which must be electrically conductive, is used for the back conductor 23 by eliminating the insulating layer 22 and the separate back conductor 23 of FIG. 2A. Electrical contact to the device can be made from the back side. This embodiment is useful for small area cells as may be produced by a pilot line.

Figure 2C:
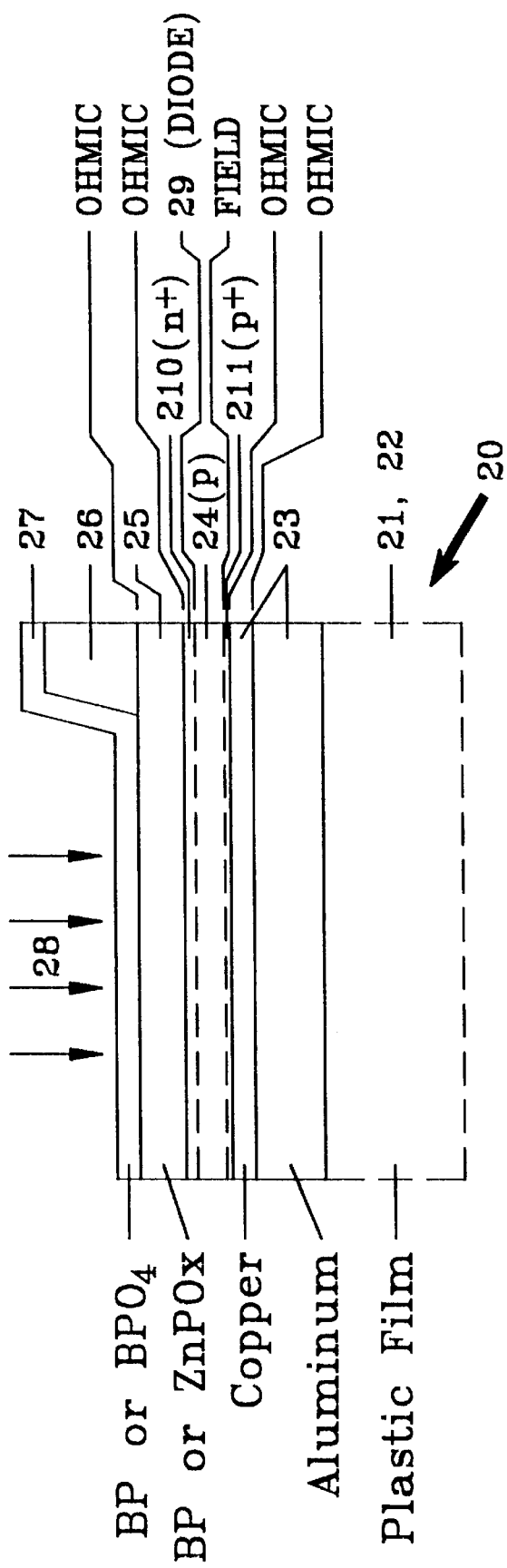

In FIG. 2C, because the substrate 21 is electrically non-conductive, insulating layer 22 of FIG. 2A has been eliminated. This embodiment would be useful for cells deposited on substrates made of ceramic, glass or plastic. This would be the preferred form for lightweight cells deposited on plastic which are illuminated from the top side. In the lightweight embodiment the materials of the layers would be selected for lightness of weight rather low cost.

Figure 2D:
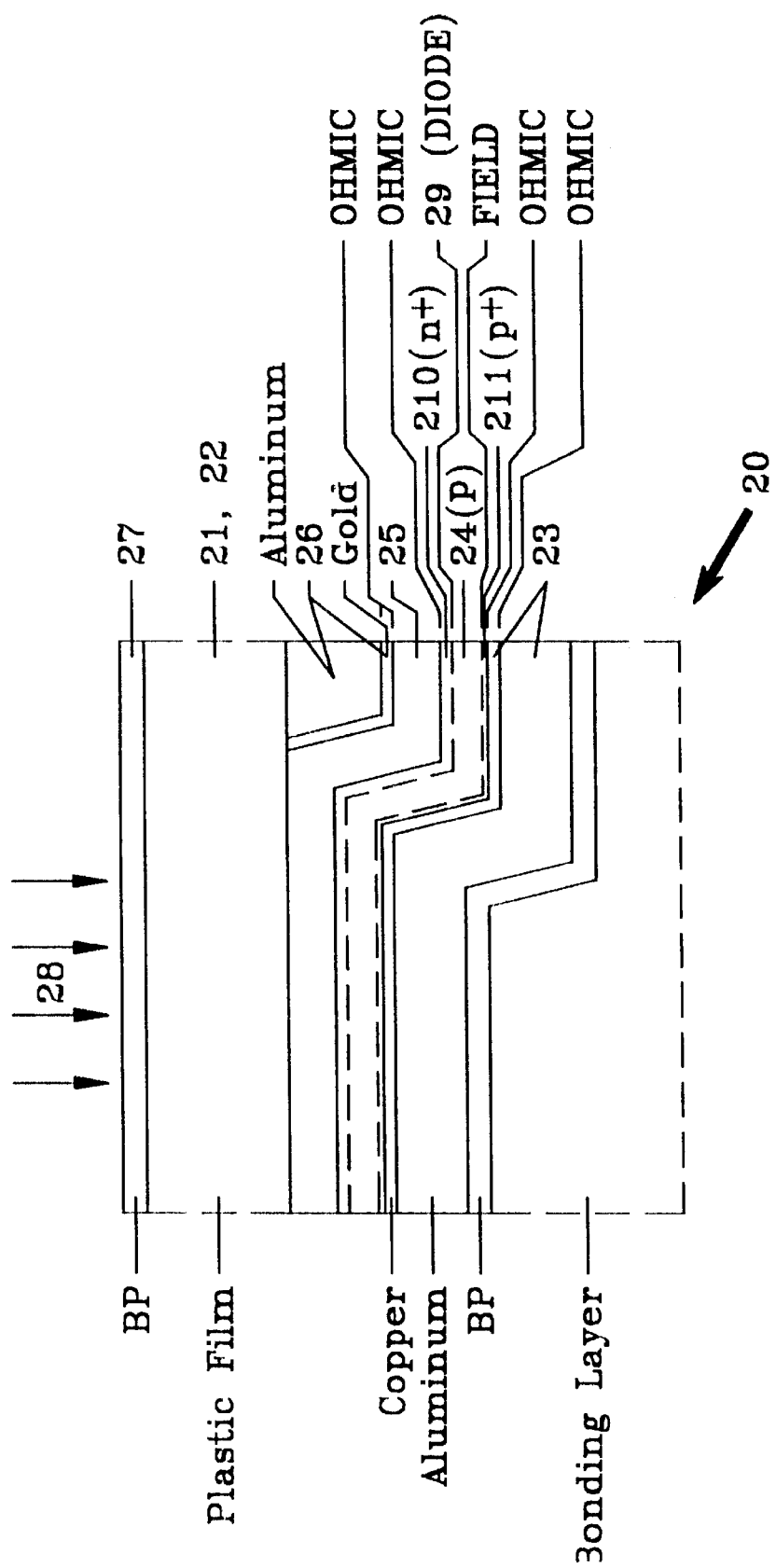

In FIG. 2D, the grid conductor 26 has been deposited on a transparent and electrically non-conductive substrate 21 prior to fabrication of the active photovoltaic device structure. The same active structure as in FIG. 2A is fabricated in the reverse order upon this structure. In this embodiment the incident light 28 enters the photocell through the substrate and is most useful when deposited upon a glass substrate. It is also useful for light weight cells deposited on plastic where the surface exposed to the light must be flat and smooth as would be the case for solar cells installed on the top surface of an aircraft's wing.

Figure 2E:
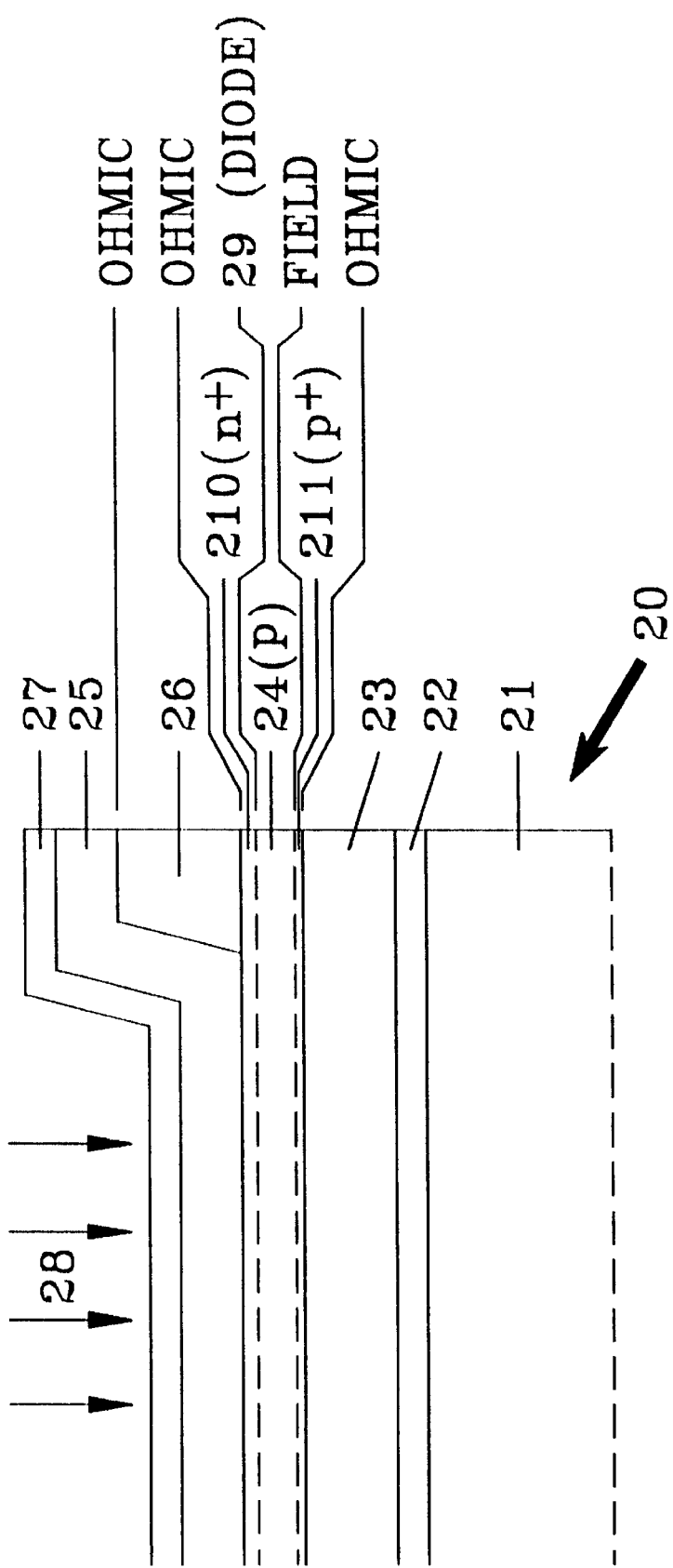

In FIG. 2E, the embodiment of FIG. 2A is modified to bring the grid conductor 26 into direct contact with the photovoltaic layer 24 and is protected from the environment by both transparent conductor 25 and antireflection coating 27.

Figure 2F:
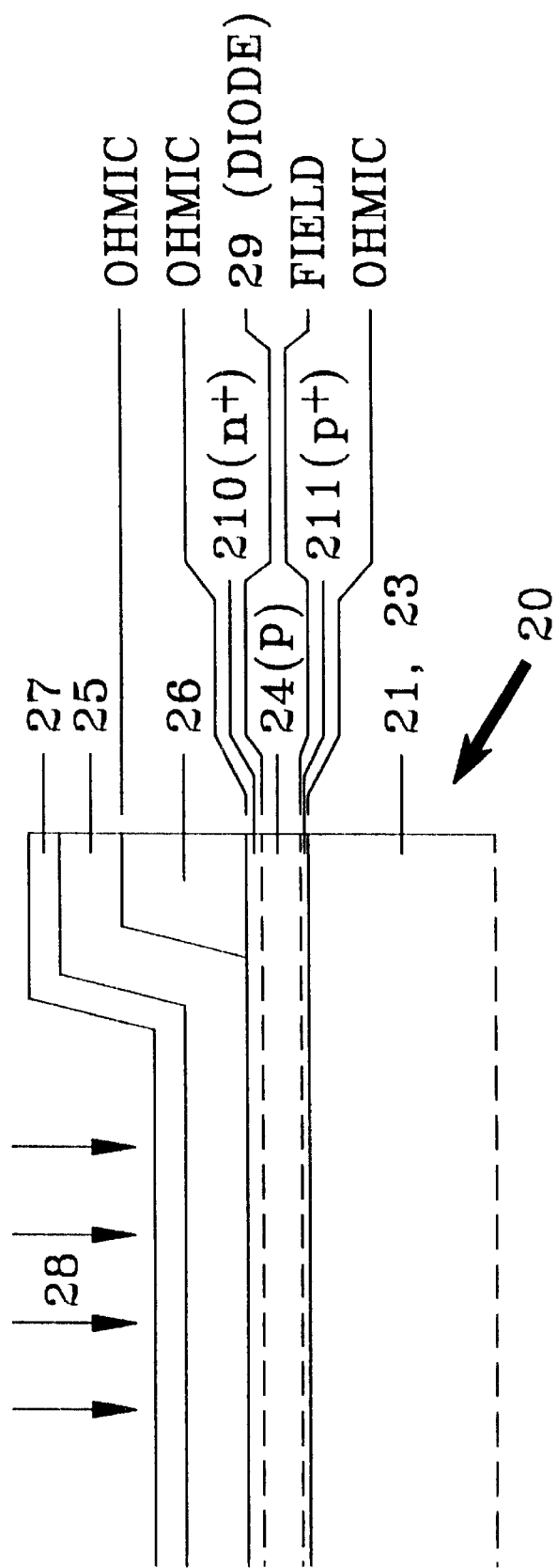

In FIG. 2F, the embodiment of FIG. 2B is modified to bring the grid conductor 26 into direct contact with photovoltaic layer 24.

Figure 2G:
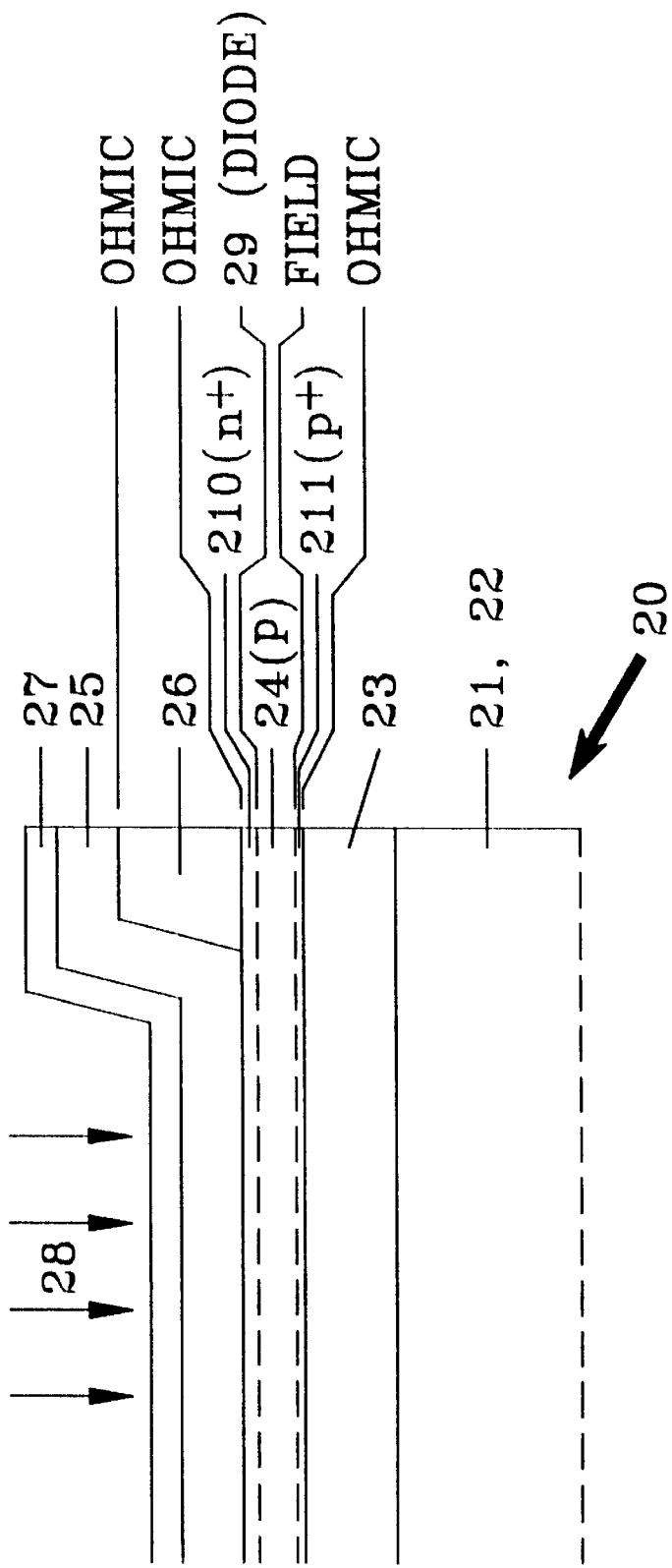

In FIG. 2G, the order of fabrication of the transparent conducting layer structure of FIG. 2C is modified to bring the grid conductor 26 into direct contact with the photovoltaic layer 24.

Figure 2H:
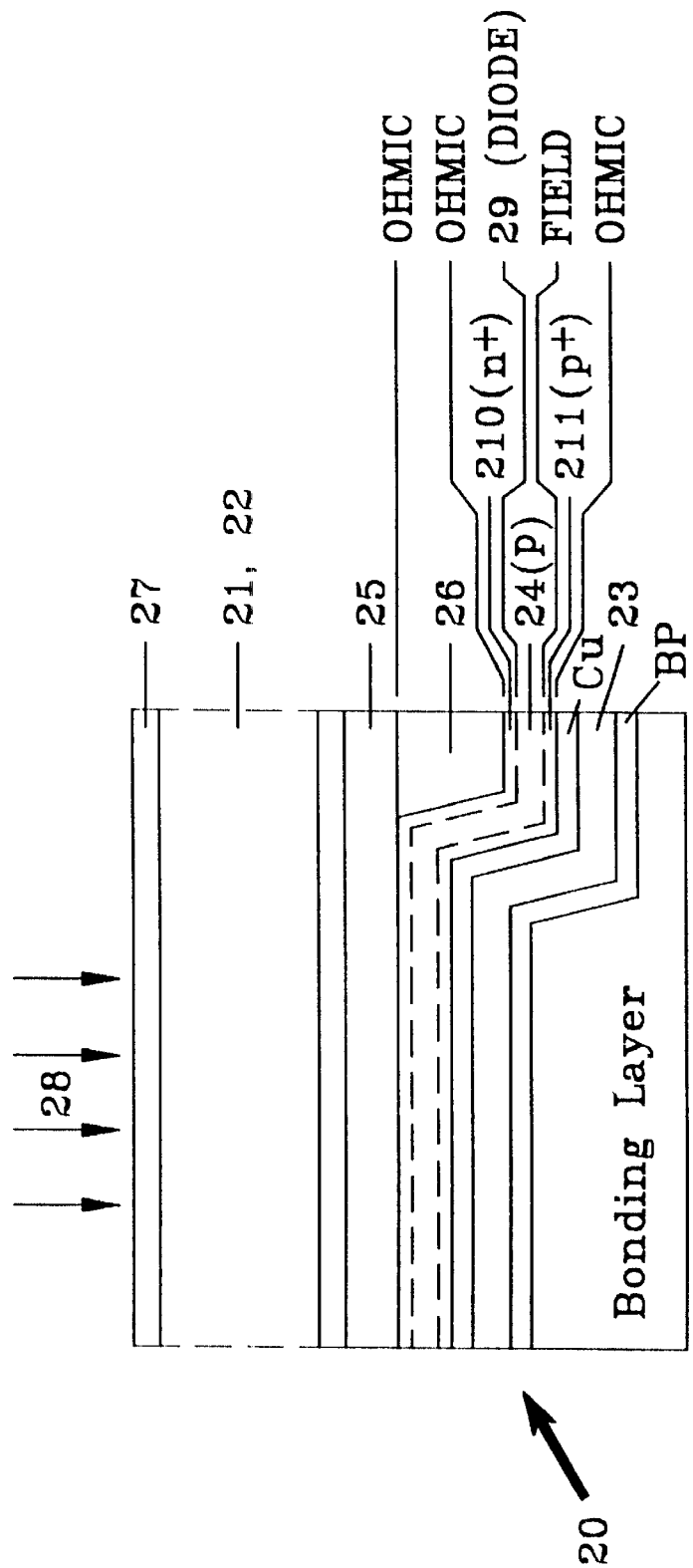

In FIG. 2H, the embodiment of FIG. 2D is modified to deposit the transparent conducting layer 25 directly on the transparent substrate 21 and serves to protect the substrate from the process conditions used to form the subsequent grid conductor layer 26. The incident light 28 enters the cell through the transparent substrate. The rest of the cell layers are deposited in the reverse order to the embodiment of FIG. 2A.

Figure 2I:
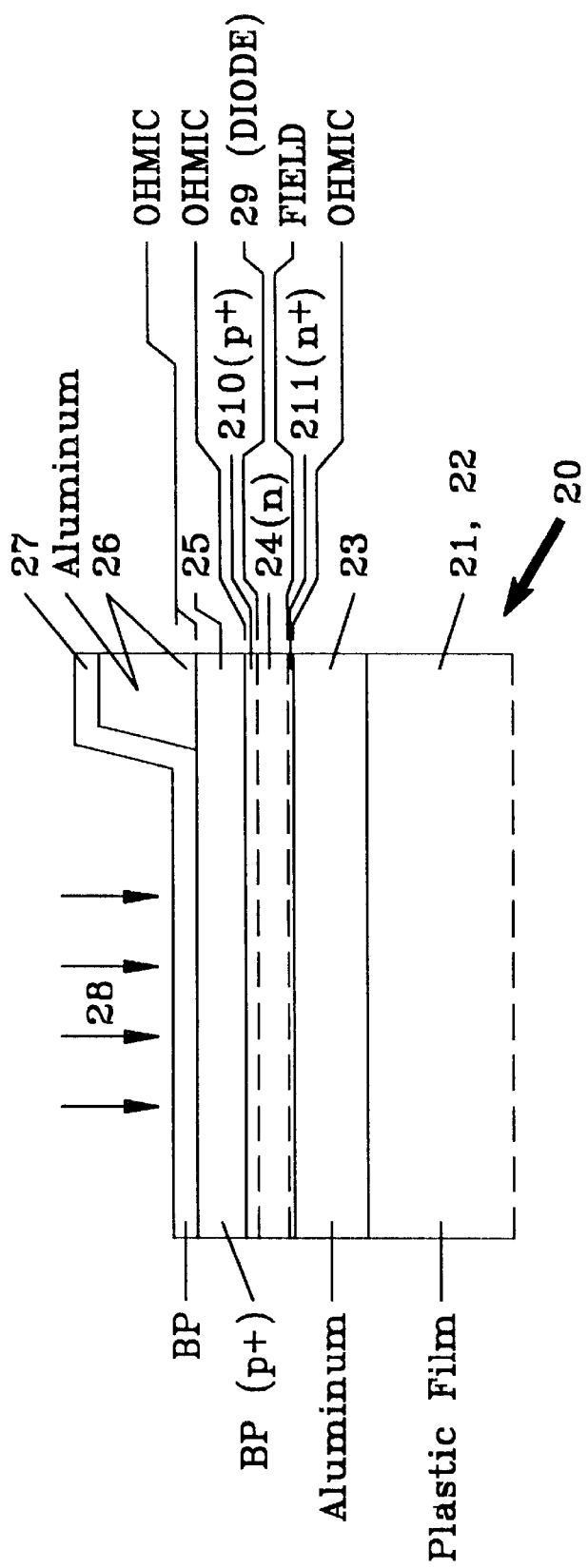

In FIG. 2I, the embodiment of FIG. 2C is modified by inverting diode junction 29 types from n+-on-p to p+-on-n and the use of a p+-type transparent conducting layer 25 and a n+-type back surface field region 211. This embodiment enables the use of a lightweight back conductor 23 and an extremely durable material, boron phosphide, for transparent conducting layer 25 and produces a lightweight cell that is extremely durable.

Figure 2J:
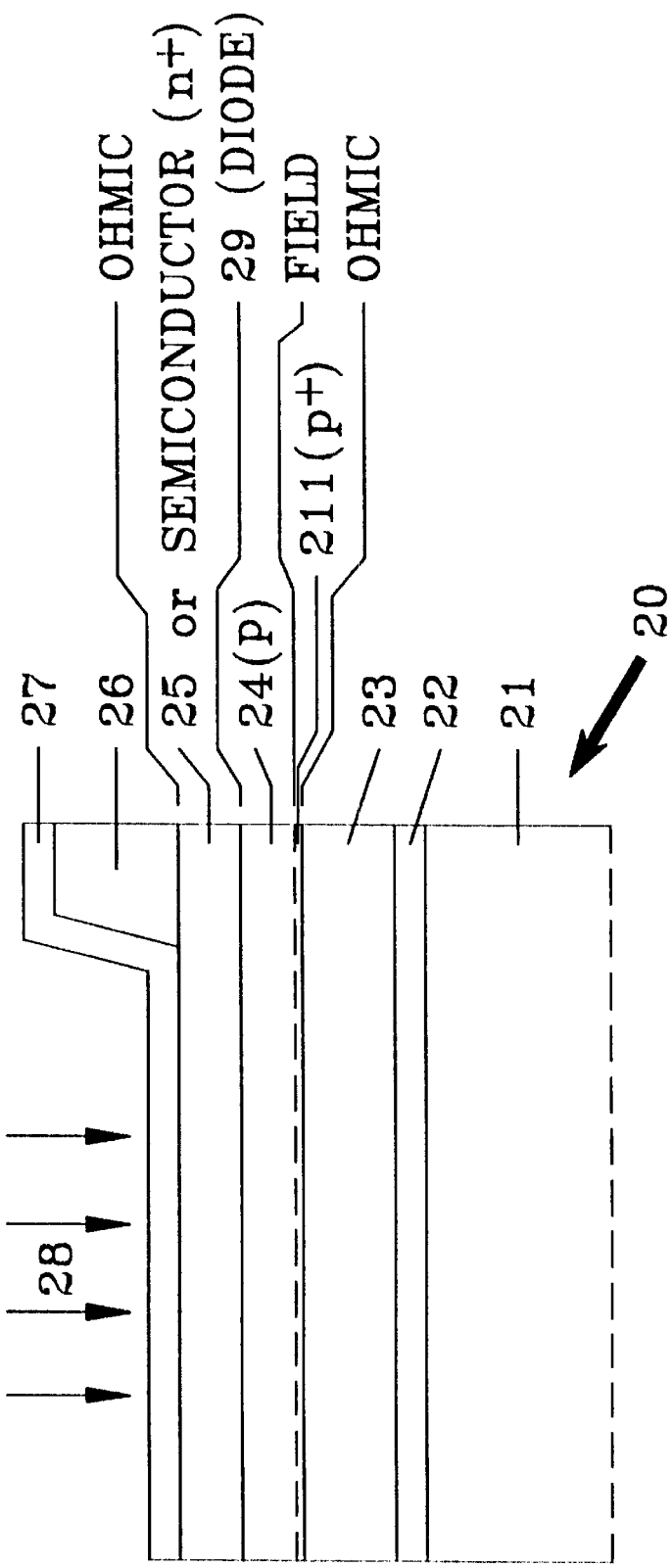

In FIG. 2J, the buried p-n homojunction of FIG. 2A is replaced by a heterojunction formed between the photovoltaic layer 24 and the transparent conductor 25. While this junction formation method would work equally well using p-on-n or n-on-p junctions types, this figure illustrates the embodiment that uses a p-type photovoltaic layer 24 and an n+ type transparent conducting layer 25. This embodiment could use hard, chemically resistant boron phosphide for the transparent conducting layer 25 to give an extremely durable photocell. Slight adjustment of the process would form the embodiment of FIG. 2A with an n+-type layer 210 by boron doping.

These various embodiments illustrate that: (a) the grid conductor 26 can make direct contact with the photovoltaic layer 24 or can make indirect contact through a transparent conductor 25; (b) the photovoltaic layer 24 can have an inverted structure in which the n-type layer is on the bottom and the p-type layer is on the top; (c) the diode junction in the photovoltaic layer 24 can be formed on the front surface at the heterojunction between the photovoltaic layer 24 and the transparent conductor 25; (d) the diode junction in the generating layer can be formed by replacing part of the zinc diphosphide photovoltaic layer with a zinc diarsenide photovoltaic layer, thereby producing a dual wavelength absorber; (e) the photovoltaic cell can be produced in an inverted order on a transparent substrate; (f) the photovoltaic cell can be formed with electrical contact to the back of the cell using a conducting substrates 21; (g) structures can be used to protect the grid conductor 26 from environmental conditions; (h) structures are available for use of very lightweight flexible materials for potential space application; (i) structures are available that enable the use of highly durable and chemically resistive materials for applications in corrosive environments; and (j) structures are available for use in solar powered aircraft.

β-Zinc Diphospide Passivation

Tests of β-zinc diphosphide have shown that it decomposes slowly when exposed to atmospheric moisture and heat. There is negligible decomposition under ordinary conditions, but when a solar photovoltaic cell is exposed to heat, light and moisture, its surface will corrode. If the photovoltaic junction is shallow, it will be strongly affected by such surface corrosion. Following are two different solutions to this problem.

Buried Junction Embodiment: One solution to this problem is to form the diode junction a small distance within the photovoltaic layer so that corrosion of the layer surface does not reach the photosensitive diode junction. The photosensitive diode junction must be a pn junction because any decomposition of the layer would start at the interface between zinc diphosphide and the adjacent surface layer and if this interface were also the junction then the slightest decomposition there would severely degrade the junction quality. Also, the p/n junction device will have a higher efficiency since there are no recombination centers at the interface as would be typical for heterojunction between two layers of different materials. In the special case of epitaxial growth, where the two materials have the same crystal structure and almost identical lattice parameter (such as $ZnP_2$ and $ZnAs_2$) an efficient heterojunction can be formed. However, diffused junctions have the advantage of being less expensive to fabricate. For an unpassivated photovoltaic cell having a buried junction, slight surface decomposition will only slightly degrade cell efficiency due to a small loss of optical clarity at the surface.

Passivated Junction Embodiments: The most efficient cell would have the shallowest junction because the carriers to be collected are strongly absorbed near the surface of a direct gap material. The use of a shallow junction requires a minimum depth of any surface corrosion so the use of a passivating layer between the surface and the environment would enable the use of a shallower junction and increase the efficiency of the cell. This passivation layer must either prevent oxygen and moisture from reaching the surface of the photovoltaic layer or must prevent phosphorous oxides (that is result from by such corrosion) from escaping through the surface of the photovoltaic layer. Almost any continuous, pinholefree layer of sufficient thickness having a low moisture and oxygen, or phosphorus oxide, diffusivity will achieve this result.

The efficiency of a shallow junction device will be low if it is not in contact with a layer of material having a high electrical conductivity material since ohmic losses will degrade the efficiency. Thus, a transparent conductor 25 should be included that also functions as a passivation layer. One particular class of materials that are suitable for this dual function are conductive oxides, such as zinc oxide (ZnO), tin oxide ($SnO_2$), tin-doped antimony oxide ($Sb_2O_3$) or tin-doped indium oxide ($In_2O_3$).

In order for this passivation layer to also function efficiently as the transparent conductor, it must be relatively thick (on the order of several microns). In general, this requires that this layer be thicker than the photovoltaic layer. This means that the material cost of this layer can be a significant part of the material cost of the photovoltaic cell. This, in turn means that the chemical components must likewise be subject to the same limitations as the chemical components of the photovoltaic material -- namely, they should be inexpensive, abundant, nonpolluting and not subject to control by a cartel. Zinc oxide is the preferred choice due to these reasons.

In addition to these well known conductive oxides, zinc phosphate is a good choice because: all of its components are abundantly available; zinc and phosphorous sources are already required to manufacture the β-$ZnP_2$ photovoltaic layer, thus reducing the complexity of the fabrication apparatus and providing the economy of commonality; its ability to be doped to high conductivity using conventional dopants; and its high optical transparency. Three different zinc phosphate stoichiometries are possible (i.e., $xZnO:P_2O_5$ where x=1, 2, or 3), thereby increasing the ability to optimize performance. All three of these stoichiometries have the requisite optical and physical properties and can be doped n-type by substitution on the metal lattice, as is typical in high efficiency conductive oxide structures. The substituent can be selected from Group III elements (i.e., B, Al, In, or Ga), Sn or Sb. These all are sufficiently available for use as low concentration dopants, even at the levels required for conductive oxides, but B, Al, Sn and Sb are the most economically viable choices. The preferred choice is aluminum because of it low cost and high availablity.

Solid Source OMCVD of Metal Phosphides:

There is another method of sourcing for OMCVD. This uses a solid rod that is a pressed powder or solidified melt. The composition of the rod is the same as the vapor composition. The rod is fed in to a region of a high temperature gradient proportional to the desired growth rate at the substrate. The gases from the vaporizing rod are carried to the substrate by an inert or reactive carrier gas. The growth chamber may be at atmospheric or reduced pressure. The walls are heated to prevent condensation of the reactive species. A bypass valve is installed to allow the growth transient associated with a new rod to bypass the growth site before growth begins.

The advantages of this system are the simplicity of the sourcing method, its suitability a process utilizing to heated walls and its ability to use organometallic species with a high melting point.

This growth method is especially useful for the growth of a continuous film such as that envisioned for solar cell manufacturing production line. It has the further advantage that rods can be mass produced to high tolerances at a central location to produce identical growth results in production lines located at widely distributed locations.

This method is particularly suited to the growth of the proposed solar cell materials ($ZnP_2$, $CuP_2$, $MgP_4$, and $FeP_4$). All of these have useful organometallic species that are solid at room temperature.

In all these cases, the carrier gas will be hydrogen which may be diluted in an inert gas.

The preferred phosphorus species for the growth of all phosphides is white phosphorus which melts at 44° C and boils at 280° C. These are near ideal properties for this sourcing method.

The preferred zinc species for the growth of $ZnP_2$ is diphenylzinc which melts at 107° C. and boils at 280–285° C. This is near ideal for use with white phosphorus. Also, bis(cyclopentadienyl)zinc, bis(methylcyclopentadienyl) zinc, bis(pentamethylcyclopentadienyl) zinc are all useful and available. None of these species contains any oxygen atoms.

The preferred magnesium species for the growth of $MgP_4$ is bis(cyclopentadienyl)magnesium which melts at 176° C. and boils at 290° C. is near ideal. Bis (pentamethylcyclopentadienyl) magnesium is also useful and available. None of these species contains any oxygen atoms.

The preferred copper species for the growth of $CuP_2$ is copper(I) phenylacetylide which contains no oxygen atoms. This compound is useful and available. There are other organometallic copper species containing oxygen atoms where research growth of other compounds has shown that the oxygen is not incorporated into the films. The preferred species of this type that are useful and available in high purity are copper(II) hexafluoroacetylacetonate and copper (II) trifluoroacetylacetonate.

The preferred iron species for growth of $FeP_4$ is bis (cyclopentdienyl)iron (ferrocene) which melts at 172° C. and bis(diphenylphosphino)ferrocene which melts at 180° C. There are many other useful iron compounds but these have the advantage in containing no oxygen atoms.

Dopants can be introduced into the phosphides in two preferred ways: either the dopant is introduced as a solid into the rod in a very dilute composition; or the dopant is introduced into the carrier gas stream from a hot source bubbler through a heat tube. The second method is preferred because it provides superior control of the dopant concentration and also allows precise control of the growth of abrupt and step junctions during layer growth.

Methods of Ohmic Contact to Back Conductor:

A key aspect of the preferred embodiment is forming an ohmic contact to the bus conductor when the p-type $ZnP_2$ layer is grown upon it. There are several methods to do this:

1. High purity oxygen free copper is the preferred material for the back conductor. Copper can be used for the back conductor layer or for the top layer in a back conductor stack. This is a p-dopant in $ZnP_2$, the interlayer ($Cu_3P$) is metallic, and thus an ohmic contact is formed to it. This is especially attractive because copper is an excellent conductor and foils of it can be obtained easily. This is an elegantly simple and effective process. This is the preferred method to make this contact and is useful whether of not the primary material for the back is copper. This is useful for forming an ohmic contact to an aluminum back conductor.

Alternate materials of this type include ordinary purity copper for the back conductor. Copper based alloys especially brasses (Cu/Zn), phosphocopper alloys (Cu/P), cupronickel (Cu/Ni), bronzes (Cu/Sn), etc. are especially useful for substrates integrated with the back conductor (as embodied in FIG. 2B) because they have superior mechanical properties, good electrical conductivity, and are readily available in foil form.

There is no mention in the literature of copper being used to make ohmic contact to $ZnP_2$ or as a substrate for growth of $ZnP_2$ that was later shown to give a good electrical contact. There is no mention either of copper being the substrate for any CVD growth of phosphides which may be explained but the perception that phosphide of the layer would prevent ohmic contact. No transition metal (except Au) has every been used to contact $ZnP_2$ and no metal (except Al and Au) has ever been used as a substrate for $ZnP_2$ deposition and shown to form an electrical contact. And these depositions where by evaporation and not CVD.

2. Molybdenum could also be used in an integrated process to advantage because it makes an excellent substrate foil, foils are available, it has good thermal expansion matching to $ZnP_2$, and can form an ohmic contact by the formation of a metallic interlayer ($MoP_2$).

3. Thin interlayers of p-doping species (Cu, Ag, Li) can be used to form an ohmic contact. These diffuse into the growing layer forming a p+ region that forms the contact.

4. Thin interlayers of noble metals (Au, Pt, Pd) can be used to form an ohmic contact. It is believed that these do react to form metallic interlayer compounds that form ohmic contact.

5. Interlayers of several transition metals (Ti, V, Cr, Mn, Mo, W, Ta, Fe, Co, Ni, Cu) that are known to form either low bandgap p-type semiconducting compounds or metallic conducting compounds can also be used to form an ohmic contact.

Transparent Conducting Layers of Zinc Phosphate:

Zinc phosphate is the preferred material system for the conducting oxide layer. The advantages of this system are that:

1. All of the elements are plentifully available.
2. All of the elements can be deposited from the vapor for an efficient and useful OMCVD process.
3. It is possible to n-dope these phases by use of group III elements and tin.
4. All phases have acceptable physical and chemical properties for use as a passivating and protecting layer.

There are several stoichiometries and morphologies that can be employed for the conductive oxide layer:

1. Zinc metaphosphate ($ZnO:P_2O_5$).
   a. The Zn:P ratio is the same as $ZnP_2$ which means that the interface is more stable towards interdiffusion which yields to desired abrupt interface.
   b. The electonic configuration of $ZnP_2O_6$ is analogous to $3SiO_2$. Thus, introduction of $SiO_2$ into the layer is possible to affect the crystal structure without effecting the electronic structure.
   c. This stoichiometry has been shown to exist in both amorphous and crystalline forms.
2. Polycrystalline zinc metaphosphate ($ZnO:P_2O_5$). The Zn:P ratio is the same as $ZnP_2$ which means that the interface is more stable towards interdiffusion which produces a desired abrupt interface.
3. Polycrystalline zinc pyrophosphate ($2ZnO:P_2O_5$).
4. Polycrystalline zinc orthophosphate ($3ZnO:P_2O_5$). The is the most thermodynamically stable zinc phosphate and is the ultimate decomposition product of $ZnP_2$ thermal oxidation. This material is therefore the easiest phase to grow. This phase has been shown to form a passivating layer on $ZnP_2$ exposed to atmospheric decomposition at a thickness of approximately 1 micron.

The phase that will be used for the device will be determined based upon the optimum combination of maximum optical transparency and maximum electrical conductivity. This will be a function of dopant introduction, process history, and silicon introduction. The actual conductive oxide phase will have the general formula: $xZnO:P_2O_5:aSiO_2:bM_2O_3:cSnO_2$, where M is a group III element x=1, 2 or 3 and a, b and c are arbitrary. This phase is referred to generically as "zinc phosphate" ($ZnPO_X$).

Growth of Zinc Phosphate by OMCVD:

Liquid source OMCVD is the preferred way to grow films of zinc phosphate for the transparent conducting layer. There are two chemistries that can be used for the growth of these materials that are cheap enough to be useful for low-cost solar cells:

I. Zinc phosphate can be formed by the reaction of organometallic zinc (DEZ or DMZ) with phosphorus trioxide ($P_2O_3$) in the presence of oxygen ($O_2$) in the gas phase. This is the preferred chemistry for the deposition of $ZnPO_X$. The advantages of this chemistry are:
  1. The lower melting point of $P_2O_3$ (23.8° C.) allows reduced source temperature. This reduces the specifications and cost of source equipment.
  2. The lower boiling point of $P_2O_3$ (175.4° C.) allow lower wall temperatures. This greatly reduces the temperature requirements of the equipment and reduces cost.
  3. The oxidation reaction of $P_2O_3$ to $P_2O_5$ is slower and thus potentially more controllable than the reaction of $P_4$ to $P_2O_5$.
  4. The species contains most of the oxygen required by the process thus reducing the oxygen concentration required in the gas stream thereby further increasing the controllability of the reaction. The advantage of the lower oxygen concentration is the controllability of the oxidation of the zinc and doping species.
  5. As a result, the growth process will be the most robust and the simplest to develop.

II. An alternate reaction can be used where zinc phosphate is formed by the reaction of organometallic zinc (diethylzinc {DEZ} or dimethylzinc {DMZ}) with white phosphorus ($P_4$) in the presence of oxygen ($O_2$) in the carrier gas phase. The advantages of this chemistry are the commonality with the $ZnP_2$ growth chemistry which allow integration of the two layers in the same reactor with the least possible components. This process has advantages for development of an integrated research reactor.

In both chemistries, dopants will be standard organometallic compounds of Group III elements (Al, In and Ga), or boron hydride (diborane), or tin hydride (stannane). These will be introduced along with the zinc species.

For growth of the $ZnO:P_2O_5$ stoichiometry phase, especially using the amorphous morphology, silicon hydride (silane) will be used.

A two-stage process can be employed to reduce oxygen concentration during the primary growth phase. The film will be deposited without being fully oxidized using a low oxygen concentration followed by an oxygen treatment process after the organometallic are out of the gas stream.

Growth of Zinc Phosphate by Solid Source OMCVD:

Solid source OMCVD is useful for the growth of zinc phosphate. Several methods can be employed to grow these phases:

I. The mixture of the zinc species and solid white phosphorus are adjusted to give the desired stoichiometry. In this case, the carrier gas will be oxygen typically diluted in an inert gas. Dilute hydrogen may also be used to help dissociate the organometallic without complete decomposition.

Since the rod for the growth of $ZnP_2$ and the growth of $ZnP_2O_6$ are identical with the distinction between the phase being due to the different composition of the carrier gas, this reduces the cost and simplifies the growth a device formed from these to materials.

The preferred zinc species for the growth of zinc phosphate is diphenylzinc which melts at 107° C. and boils at 280–285° C. This is near ideal for use with white phosphorus. Also, bis(cyclopentadienyl)zinc, bis(methylcyclopentadienyl) zinc, bis(pentamethylcyclopentadienyl) zinc are all useful and available.

II. An alternate method is to form the rods with a mixture the above preferred zinc species and solid phosphorus trioxide. Growth takes place in an oxidizing atmosphere. The advantages of phosphorus trioxide are:
  1. Its melting which is just above room temperature (23.8° C.) simplifying rod manufacture from the melt.
  2. It boiling point is 175.4° C. which offers low wall temperatures.
  3. It carries most of it own oxygen, reducing the required oxygen concentration in the carrier gas.
  4. It reacts readily yet slowly with oxygen to produce the completely oxidized form of the phosphorus pentoxide stoichiometry ($P_2O_5$) with is desired at the substrate.

III. An alternate method is to form the rods with a mixture of the above preferred zinc species and phosphorus pentoxide. This method requires the use of the hexagonal modification to have a sufficient vapor pressure for growth of the phase. This material has low commercial availability. This is not the preferred method for the growth of $ZnPO_X$ phases.

IV. An alternate method is to replace the preferred zinc species with ones that contain oxygen. These species have the general formula $(RO)_2Zn$. The advantages of these species are that they are simpler (and thus less costly), they have a lower formula weight (which gives a high vapor pressure), and the oxygen content of the carrier gas is further reduced. Examples of these species are methoxy- and ethoxy-zinc.

In all methods, dopants can be introduced into the phosphates in two ways: either the dopant can be introduced as a solid into the rod in a very dilute composition; or the dopant can be introduced into the carrier gas stream from a hot source bubbler through a heat tube. The second method is preferred because in give superior control of the dopant concentration and also allows precise control of the growth of abrupt and step junction during layer growth.

Protection of the Device Using a Boron Phosphide Layer

The proposed $ZnP_2$ solar cell will have a "durable" option. In this form, the cell will be coated with a layer that will mechanically and chemically protect the device from environmental hazards.

Diamond or "diamond-like" carbon layers are frequently proposed for device protection functions. While this may by useful in some embodiments, it is not preferred because of the high substrate temperature required and the slow growth rate and the requirement for plasma activation.

Nearly the same protection can be obtained by the use of boron phosphide (BP). This material is one of the hardest and most inert materials known. BP can be grown from the vapor in both n- and p-type as required by adjusting the gas phase composition.

BP is compatible with $ZnP_2$ chemically and physically and can be used for both protection, passivation and heterojunction formation as required. Any BP layer will serve to protect and passivate the $ZnP_2$. Layers of the same type will be used for passivation (no interfacial junction is formed). It can be used to form a heterojunction with either n- or p- type $ZnP_2$ by using layers of opposite type.

The preferred form of this heterojunction is to use p-type $ZnP_2$ and n-BP because boron is an n-dopant in $ZnP_2$ and Zn is a p-dopant in BP. This can be exploited to form a homojunction device by using an integrated process where a dopant-rich initial growth is followed by a standard layer growth. The preferred structure of this type is to create a shallow homojunction of n- or p- $ZnP_2$ with a protecting layer of n-type BP. The BP layer can be made thick and with degenerated conductivity for use as a transparent conductor or can be made of the proper thickness for antireflection coating (ARC) and still serve to add conductivity.

Growth of BP is compatible with the $ZnP_2$ growth processes. Gaseous boron hydride(diborane), or boron chloride ($BCl_3$), or mixed hydride/chloride, or organoboride can be used for the vapor boron species. In standard processes, phosphorus vapor species comes from phosphorus hydride (phosphine) or phosphorus chloride or organophosphide. These are compatible with the $ZnP_2$ surface. However, boron hydrides are preferred for cost and process reasons and organophosphide are preferred for safety reasons. In addition, BP can be grown by the proposed innovative process using white phosphorus as the phosphorus gas source. This will reduce the cost of the BP layer and allow process and equipment advantages due to compatibility with the preferred $ZnP_2$ growth process (which uses this source).

BP is the preferred protective material over $ZnP_2$ surfaces that require an especially hard inert protection.

Another possibility within this system is the use of $B_6P$ for antireflection layer. It is equivalently hard and inert. It is an insulator and its advantage is that it is more transparent to the solar spectrum and may be useful for maximum efficiency devices where the slight UV absorption of BP may be a problem. The lower cost and device structure advantages of BP make it the preferred material in this system.

BP is compatible with zinc phosphate chemically and physically and can be used for protection and for antireflection coating. The zinc phosphate layer will be n-type and either n- or p-type BP can be used to protect the device. If an n-type layer is used it will aid in conductivity of the transparent layers. If a p-type layer is used it will aid in the efficiency of the device by reflecting electrons for the zinc phosphate layer away from the surface and increasing the collection efficiency of the device. The type used will depend on getting the lowest resistance with the minimum loss. This will depend upon the thickness of both layers which will depend upon optimizing the combined layers for both the minimum reflectivity and minimum resistance. The exact structure will be optimized by a detailed analysis of the overall device performance.

Formation of the Back Surface Field By An Integrated Process

If copper is used for the back conductor, or if a very thin layer of either copper or lithium is deposited on the surface of the another material that is used for the back conductor, an integrated process is possible that will for the ohmic contact and back surface field in one step. During growth, or subsequent heat treatment, of the photovoltaic layer these materials will diffuse from the region of the interface between the two layers into the photovoltaic layer. This process will form a highly doped p+ layer just adjacent to the interface which will aid in forming the needed ohmic contact and can be diffused far enough into the photovoltaic layer to act as a back surface field. This out diffusion from the substrate can be controlled by the amount of the dopant deposited on the back conductor before growth, the time and temperature of the growth and subsequent heat treatment. A few minutes of heating to a temperature of above 600° C. would be sufficient for such a process. The photovoltaic layer must be protected by a phosphorus over pressure during this operation. The advantages are that this process is simpler than controlling the dopant concentration variation in a multimodule production apparatus and the cost will be reduced by eliminating the separate processes.

Formation of the Diode Junction By An Integrated Process

A transparent conducting layer that is heavily doped with an n-type dopant compatible with the photovoltaic layer material is deposited on the p-type photovoltaic layer without a diode junction. This structure is subjected to a heat treatment either during growth of the transparent conducting layer, or subsequent to it, the dopant will out diffuse from the transparent conductor into the photovoltaic layer and create a shallow p-n junction in the photovoltaic layer near the interface between the layers. This junction can be very shallow and yet separated from the interface and be both efficient and stable versus corrosion. This out diffusion can be controlled by the concentration of the dopant in the transparent conductor just adjacent to the photovoltaic layer, and the time and temperature of the heat treatment. Several minutes at a temperature above 600° C. would be sufficient to create an effective junction. The advantage of the integrated process would be a huge reduction in cost of the junction formation method by eliminating the junction formation regime in the growth of the photovoltaic layer which would eliminate an entire production module and greatly simplify the production system.

Double Integrated Production System

Since the process conditions to form the integrated back surface field and the integrated junction are very similar, it is possible to select the conditions so that both operations could be done simultaneously. This is an extremely cheap and easy method to create the structure of the preferred embodiment. In this case, there would be no doping variation during the growth of the photovoltaic layer. The process would simplify to depositing a uniform photovoltaic layer on a previously prepared substrate followed by deposition of the transparent conductor and then heating the stack for a short time to form both the back surface field and the diode junction simultaneously. This would yield the simplest and cheapest production apparatus.

OMCVD Process for β-$ZnP_2$ Deposition

Figure 3:
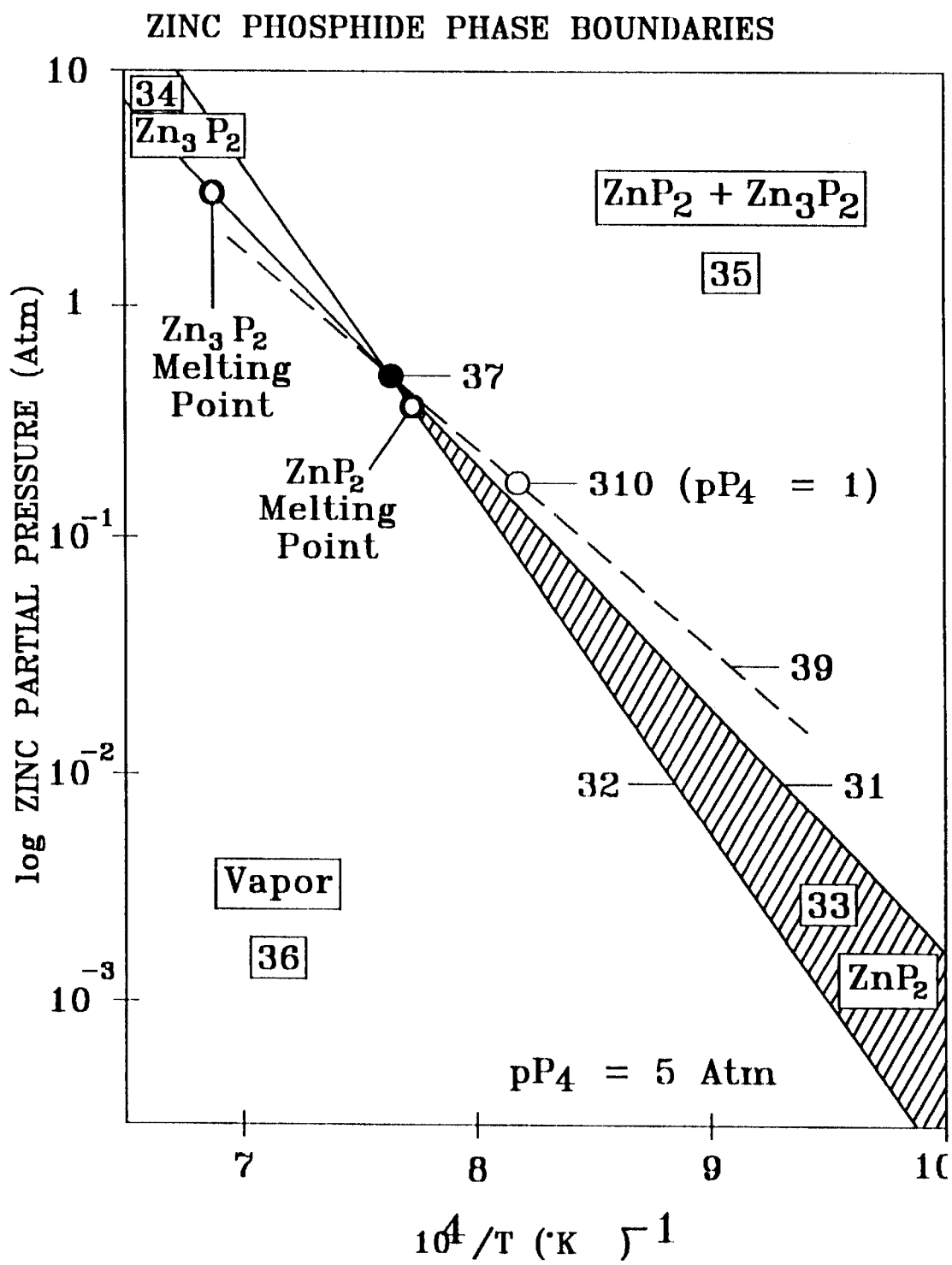
FIG. 3 is a phase diagram for ZnP$_2$ and Zn$_3$P$_2$ for a P$_4$ pressure of 5 atmosphere, a zinc partial pressure from 10 atmospheres to less than .001 atmosphere and a temperature range from about 725° C. to 1250° C.

FIG. 3 is a phase diagram for $ZnP_2$ and $Zn_3P_2$ for a $P_4$ pressure of 5 atmosphere, a zinc partial pressure from 10 atmospheres to less than .001 atmosphere and a temperature range from about 725° C. to 1250°C. Within this region, each of these two compounds can only be in either a solid or a vapor phase. Curve 31 is the sublimation curve (at fixed $P_4$ pressure) separating the solid and vapor phases of $Zn_3P_2$ and curve 32 is the sublimation curve (at fixed $P_4$ pressure) separating the solid and vapor phases of $ZnP_2$. Thus, regions 33–36, respectively, contain the following phases: solid $ZnP_2$ only; solid $Zn_3P_2$ only; a solid phase containing both solid β-$ZnP_2$ and solid $Zn_3P_2$; and a gas phase containing both zinc and phosphorus molecules. Point 37 is the quadruple point between the four different phases illustrated in that figure. Line 39 is the locus of the quadruple point as the phosphorus pressure is varied. Point 310 is the position of the quadruple point at 1 atmosphere of phosphorus pressure. Lines 31 and 32 will intersect at point 310 if the phosphorus pressure is fixed at one atmosphere and they will be parallel to the direction that they have on the figure at all pressures.

The key point of this figure is that there exists a substantial region of zinc pressure and temperature containing only the β-zinc diphosphide phase. This will be called the "single phase" region 33 as compared to the "double phase" region 35 where both $ZnP_2$ and $Zn_3P_2$ are thermodynamically stable. It is preferred to grow $ZnP_2$ in the single phase region because any deposit obtained would be pure $ZnP_2$ and there would be no regions of the deposit having the $Zn_3P_2$ stoichiometry. There should be no sites within any crystal in the film (which is assumed to be polycrystalline) where a zinc or phosphorus atom would be coordinate as it would be in $Zn_3P_2$. The quality of the resulting film would be the highest where the deposit is microscopically $ZnP_2$ solely.

It is possible to grow essentially pure $ZnP_2$ within the double phase region by growing the films with a large excess of phosphorus (relative to the amount of zinc present) where the flux to the surface would promote the growth of $ZnP_2$, the phosphorus rich phase, to the apparent exclusion of $Zn_3P_2$. It is possible to grow high quality thin films of $ZnP_2$ under this growth regime by use of this phosphorus excess. However, the cost of films grown under this excess of phosphorus would be much higher than those grown in, or at least near, the single phase region. Any phosphorus in the gas stream in excess of that required for stoichiometric growth, will pass through the reactor without deposition. This "wasted" phosphorus is costly and contributes to the waste treatment problem of the reactor exhaust and to the potential for environmental pollution due to the growth process.

Figure 4:
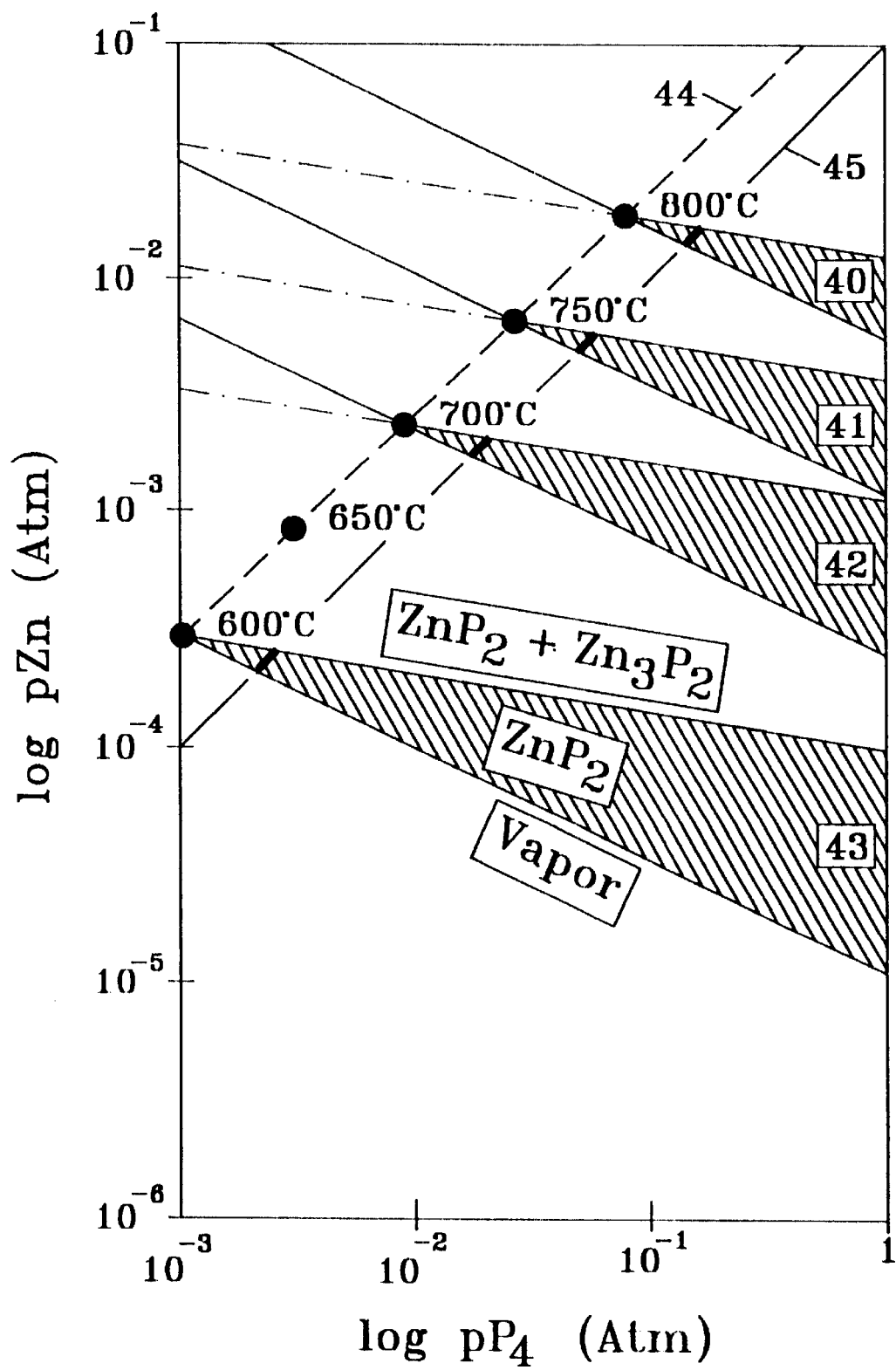
FIG. 4 is an alternate representation of the phase diagram of FIG. 3 in which the data is displayed for variable zinc and phosphorus partial pressures at several fixed temperatures.

It is therefore critical to determine precisely of the location of this region of phase-space determined by the space variables. The variables of temperature, phosphorus partial pressure and zinc partial pressure may be used. These have been determined from the measured thermodynamic properties of $ZnP_2$ (and also $Zn_3P_2$). The best available thermodynamic information was analyzed for these variables. FIG. 3 is one representation of this analysis (where phosphorus pressure was held constant). Another representation is FIG. 4 where temperature is held constant. This is a more useful representation because the growth substrate is held at a fixed temperature. This figure shows four single phase regions (40, 41, 42, and 43) bounded by the zinc and phosphorus partial pressures at each of 4 fixed temperatures (800° C., 750° C., 700° C. and 600° C., respectively).

It can be observed that at a temperature as high as 800° C. there is a substantial single phase region 40 for the growth of $ZnP_2$ where the total pressure is less than an atmosphere. Therefore, by appropriate use of an inert diluent, an atmospheric pressure vapor deposition process can be implemented to deposit a layer of β-zinc diphosphide, thereby enabling the manufacture of wide sheets (for example, a meter wide) of photovoltaic cells, having a β-zinc diphosphide photovoltaic layer. At a temperature of 800° C., the total pressure at the quadruple point is about 0.1 atmosphere (76 torr). This indicates that at temperatures as high as 800° C., single phase zinc diphosphide can be grown using plasma enhanced CVD using microwave (2.45 GHz) plasmas excitation sources. These sources operate effectively in the pressure range from 1 to 100 torr total pressure.

At a temperature of 600° C. (considering region 43), the total pressure at the quadruple point is about 0.001 atmosphere (0.76 torr). This indicates that at temperatures as high as 600° C., zinc diphosphide can be grown using plasma enhanced CVD using radio-frequency (13.56 MHz) plasma excitation sources. These sources operate effectively in the pressure range of 1 to 10 torr total pressure.

There are other phase-space variables that can be used to define the boundary of the one phase region for $ZnP_2$ growth. These are temperature, total pressure and phosphorus/zinc partial pressure ration. It will be observed that locus in the quadruple point at a fixed temperature is given by line 44. The ratio of phosphorus ($P_4$) to zinc (Zn) atoms is 6 at the quadruple point under all conditions (i.e., along line 44). This is the minimum ratio that will permit growth of single phase $ZnP_2$. Thus, a reactor that is designed to grow single phase $ZnP_2$ will operate near to, but to the right of, line 44. Line 45 represents a typical growth condition were the phosphorus to zinc partial pressure ratio is 10. A reactor operating at this ratio will grow single phase $ZnP_2$ provided the total pressure is appropriate to the substrate temperature. Because growth at the exact quadruple point condition would yield multiple phases, this excess phosphorus is used to move the growth conditions away from the quadruple point into the single phase region but without a substantial cost increase due to large excesses of phosphorus. It also allows for fluctations in the temperature of the substrate and partial pressures of the species while maintaining the single phase growth condition over the range of fluctuation experienced.

Figure 5:
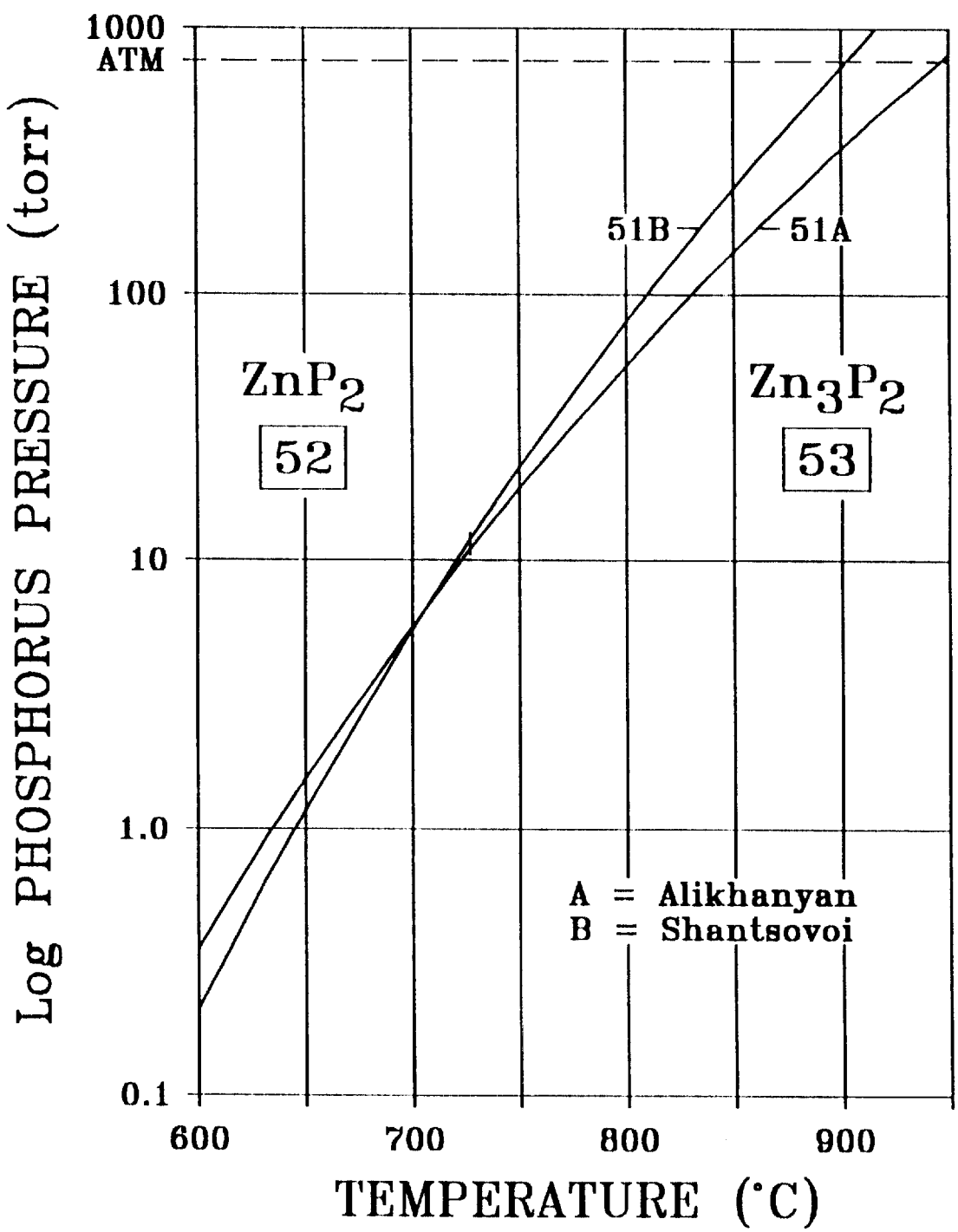
FIG. 5 plots the ZnP$_2$ decomposition pressure as a function of temperature.

The exact location in phase space of the single phase region must ultimately be determined by detailed growth experiments. The thermodynamic theory used to project these conditions are based upon a precise determination of the vapor pressures and decomposition conditions of the compounds involved (in this case, $ZnP_2$ and $Zn_3P_2$) at the temperatures of interest. The data used to project these regions are the best available but they are not accurate enough at the temperatures of use (400–650° C.) to define these regions without further experimentation. The information presented here is the best available and gives the process whereby the best growth condition will be determined. The basic data for this analysis is shown in FIG. 5 which plots the decomposition pressure of $ZnP_2$. These lines 51A and 51B, are two determinations of this information near the temperature range of their measurements. The region to the left of lines 51 is the region of zinc diphosphide stability 52 and the region to the right is the region of $Zn_3P_2$ stability 53. The growth of $ZnP_2$ must occur within region 52 and the layer after growth must be maintained in the conditions of this region at all times during processing. Whenever the $ZnP_2$ layer is heated, there must be an overpressure of phosphorus gas sufficient to maintain the stability of the surface which is given by the bounds of region 52. Also, after the $ZnP_2$ layer is grown, it must be maintained within region 52 while it is cooled down to low temperature (roughly, below 100–200° C.).

In practice, decomposition is prevented by using a large excess of phosphorus pressure, but during growth the minimum pressure that stabilizes the phase is used because that is the lowest cost condition. Thus, the best growth conditions would be within the region 52 very near the lines 51. Thus, the total pressure at the growth condition expressed by line 45 would run nearly parallel to lines 51 and within the region 52. This offers a method to approximate the target growth condition for materials where the complete thermodynamic information is not available.

The basic process to grow the photovoltaic layer (as seen by the substrate) is (1) the substrate is introduced into the reaction chamber; (2) the reaction chamber is purged with a clean inert gas (typically nitrogen) to remove any traces of atmosphere entering with the substrate; (3) the chamber is purged with high purity hydrogen (the preferred carrier gas) to remove any residual nitrogen; (5) the substrate is heated in hydrogen to the process temperature; (6) the photovoltaic layer is grown using the predetermined conditions for single-phase growth; (7) the layer is cooled down while maintaining the phosphorus overpressure until cooled; (8) the chamber is purged with high purity hydrogen to remove any residual phosphorus; (9) the chamber is purged with clean nitrogen to remove any residual hydrogen; and (10) the completed layer is removed from the process chamber.

Figure 6:
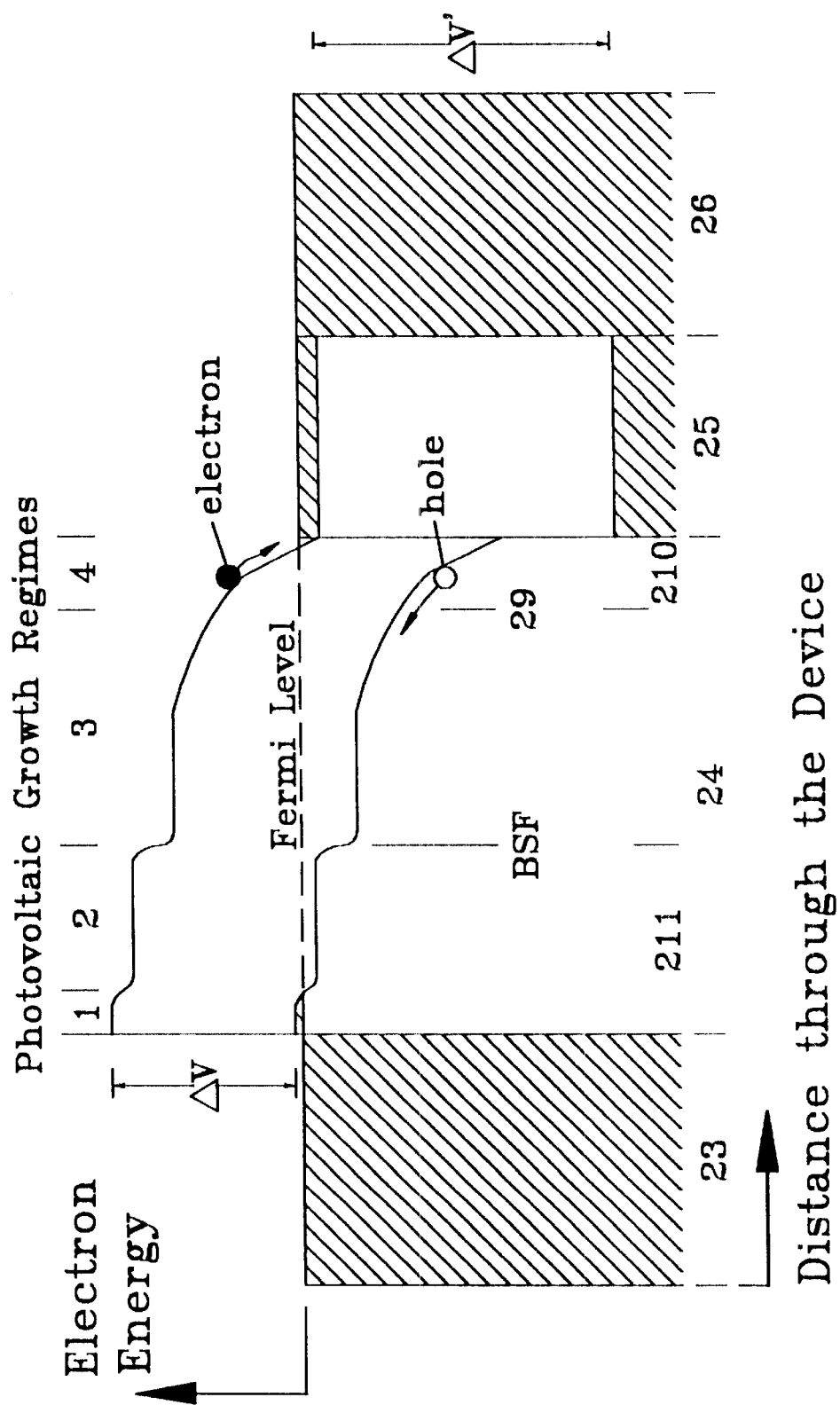
FIG. 6 illustrates the ideal electronic structure of the preferred embodiment of the proposed photovoltaic device wherein the photovoltaic layer is processed in these four regimes.

Fabrication of the structure of the preferred embodiment will require four sequential growth regimes interconnected by critical transitions during growth of the photovoltaic layer. The first regime will establish the ohmic contact to the back conductor 23 by growing p-type material where the concentration of the p-dopant will be sufficiently high at the initiation of growth to degenerate the photovoltaic semiconductor and produce the ohmic electrical contact needed to the back conductor 23. The second regime will grow the back surface field region 211. The p-dopant concentration is reduced somewhat so that a region of strongly p-doped (p+) of normal (nondegenerate) semiconductor will be grown to a thickness greater than the range of quantum mechanically tunneling electrons in this material (greater than 100 angstroms). The p-dopant concentration will drop abruptly to form the back surface field at the beginning of the third regime which will deposit most of the thickness of the photovoltaic layer 24. This region will be weakly p-type and must be of the best quality. The fourth regime will grow the strongly n-doped (n+) region 210 on the photovoltaic device. This region starts with the formation of an abrupt transition from p-type to n-type conductivity creating the collecting junction 29. The concentration of n-dopant is increased rapidly during the growth of this layer to provide a weak front surface field and ends at the surface of the photovoltaic layer with a concentration of n-dopant that may degenerate the semiconductor at the surface. FIG. 6 illustrates the ideal electronic structure of the preferred embodiment of the proposed photovoltaic device wherein the photovoltaic layer is processed in these four regimes.

In production, the "continuous" substrate will not be exposed to the atmosphere once it is introduced into the production apparatus and it will be cleaned by a plasma enhanced vapor process prior to deposition of any layers. The cleaned substrate will be translated through the apparatus and through adjacent modules with each having a different process. The basic modules required for fabricating the preferred embodiment are (1) back conductor deposition; (2) p-type photovoltaic layer deposition; (3) n-type photovoltaic layer deposition; (4) transparent conductor deposition; (5) patterned grid conductor deposition; and (6) anti-reflection coating deposition.

Zinc is easily transported to the substrate by an organometallic zinc, such as dimethyl- and diethyl-zinc, which have high vapor pressures, low decomposition temperatures, high availability and relatively low cost.

The phosphorous source can be any of several commercially-available sources, such as phosphine, t-butyl phosphine, bisphosphinoethane, trimethylphosphine or triethylphosphine. For reduced temperatures, there may be only partial decomposition of these phosphorus sources at the wafer, so that their relative partial pressures must be increased by an amount that corrects for such partial decomposition to produce the desired concentration of phosphorous at the substrate surface. Although phosphine can be used, it is not favored because of the added costs and risks arising due to its high toxicity.

The preferred phosphorous source is white phosphorus, because it is very inexpensive, is readily available in high purity, has relatively low toxicity and has a relatively low decomposition temperature (near 300° C.). It has never been used in OMCVD before, perhaps because it requires a relatively high temperature (44° C.) to melt, requires an even higher temperature to provide the required vapor pressure of phosphorus for the OMCVD process, requires a "hot-wall reactor" and a "hot-wall panel" to be discussed below.

Figure 7:
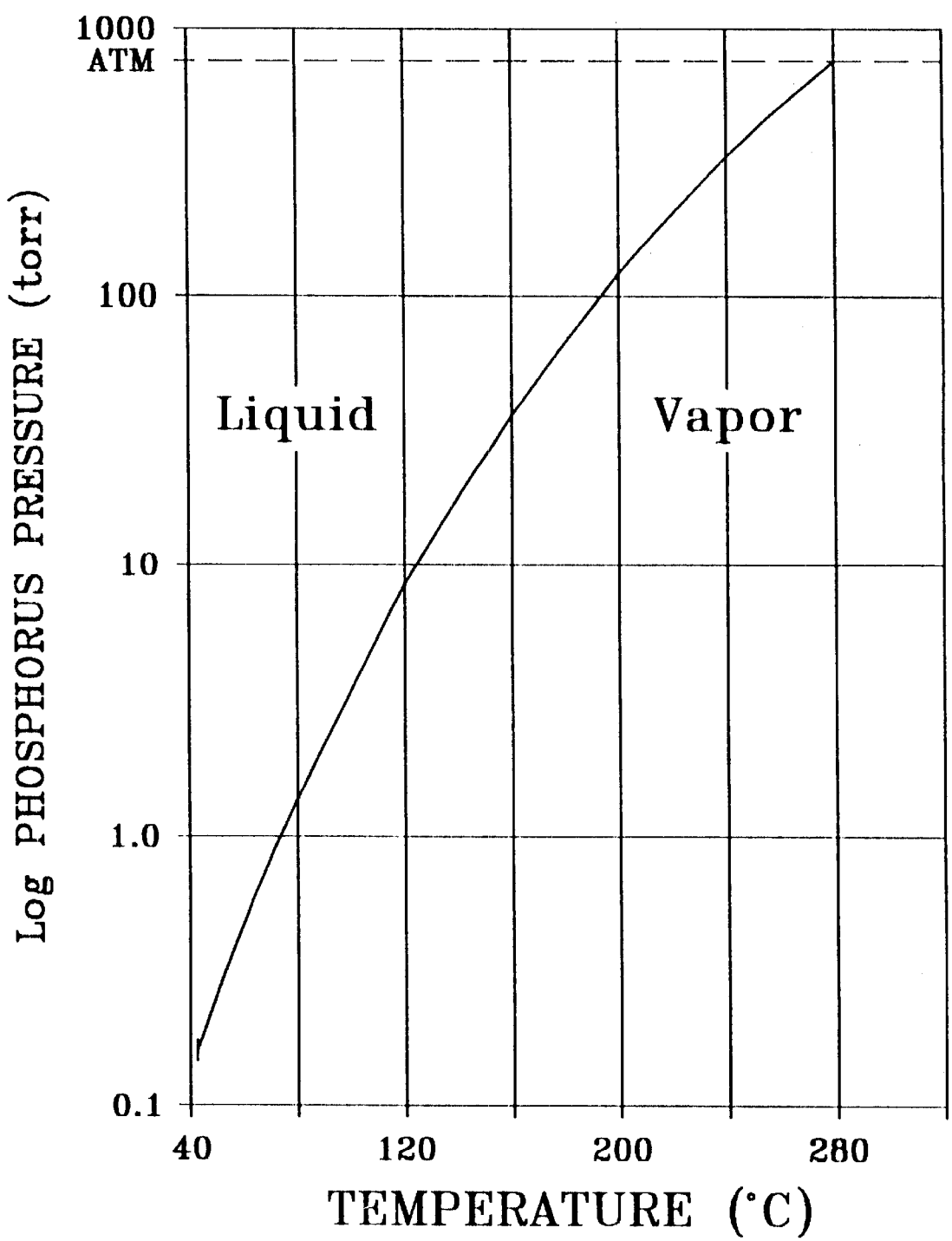
FIG. 7 plots the vapor pressure of liquid white phosphorus.

FIG. 7 plots the vapor pressure of liquid white phosphorus. This figure gives the vapor pressure of phosphorus in the heated source chamber ("bubbler") as a function of the bubbler temperature. The phosphorus vapor is carried to the reaction chamber by an inert carrier gas which dilutes the phosphorus concentration which is also diluted by further by mixing with other gases.

The actual partial pressure of the phosphorus chamber is known from the bubbler temperature and the dilution factors during transport. The temperature of any surface to which the phosphorus is exposed must be higher than the condensation temperature for the actual partial pressure of the phosphorus as given in the figure. Thus, growth at a partial pressure of phosphorus of 10 torr must have a chamber wall heated to over 130° C. Growth at the maximum useful phosphorus pressure of 300 torr would require a maximum wall temperature of 250° C. This is difficult with current reactor technology and contradicts one of the original advantages of OMCVD processes -- namely, that it use cold-wall reactors in which the walls are either at room temperature or are water-cooled, such as in the vicinity of the hot zone of the reactor. Conventional system components, such as mass flow controllers, valves, pressure controllers, will not work at these elevated temperatures. For example, typical O-rings cannot be used above 200° C. The cost of such a customized reactor design increases equipment costs, but is more than made up in production savings, especially for a product of the volume anticipated for photocells that can compete effectively against electrical power provided by electrical utilities. The advantages of this system will also be applicable to other uses, so that the cost of these reactors will drop significantly when they are needed in commercial quantities.

The best conditions for the growth of zinc diphosphide layers occur in the range of 500–600° C., with a phosphorus/zinc partial pressure ratio of 10–20, and with a total pressure of reacting species (zinc and phosphorus) in the 1–100 torr range. For the atmospheric pressure process, an inert gas, such as hydrogen, is supplied to raise the overall pressure in the reactor to atmospheric pressure, so that meter-wide substrate layers can be processed within a reactor, without the expense of enclosure walls being strong enough to produce a process pressure significantly different from atmospheric pressure. For the plasma process where excitation by microwave excitation is preferred, the hydrogen gas would be supplied to bring the total pressure to the 10–100 torr range.

There are two available p-type doping elements (copper and lithium). Copper can be purchased in extreme purity as copper hexafluoroactylacetonate and cyclopentadienyl copper trietheyl phosphine (preferred). The vapor pressure of these species is low and the chamber walls may have to be heated slightly to prevent condensation when p+-layers are grown. Lithium is available commercially as cyclopentadienyl lithium, methyl lithium (preferred) and phenyl lithium.

There are many available n-type doping elements in the form of vapor transportable compounds, the most useful being boron (hydride), aluminum (organometallic), gallium (organometallic, preferred), indium (organometallic), and tin (hydride).

Copper Diphosphide Embodiments:

With respect to the preferred embodiment and the selection of alternative materials for layers other than the photovoltaic layer, copper diphosphide is indistinguishable from the β-ZnP$_2$ embodiments. This is due to the similarity of within this class of materials in that both are p-type intrinsically and have a similar value of the bandgap. However, CuP$_2$ has a unique bandgap structure that makes it particularly attractive for solar photovoltaic devices having low cost and high efficiency. CuP$_2$ has an indirect bandgap of about 1.4 eV which is sufficient for a high efficiency because of the longer free carrier lifetimes in indirect bandgap materials but one would project from that single fact that devices made from it would have to be very thick (on the order of 100 microns) to be efficient and as such would also be more expensive. However, the direct bandgap of CuP$_2$ is at 1.5 eV which indicates that it will also have excellent absorption and be thinner (on the order of one micron). Thus, CuP$_2$ has the best of both properties, a long free carrier lifetime and a thin cell structure, indicating a very efficient and very low cost photovoltaic device is possible.

The photovoltaic layer 24 in this preferred embodiment is copper diphosphide because this low cost material efficiently absorbs the solar spectrum, efficiently transports the photo-generated carriers and can be fabricated with the abrupt p/n and p/p+ junctions needed for an efficient photovoltaic device. The critical p/n diode junction 29 can be formed as a homojunction by a doping transition within the layer during the layer growth or by diffusion from the surface after the layer growth is completed.

Copper diphosphide has a unique crystal structure where the copper atoms reside in pairs in an octahedral site. As such, while the formal valence of each copper atom is +2, conventional doping rules based upon it are less likely to apply and the most likely substitutional dopants will be small and should be able to bind covalently with like atoms. Thus for standard substitutional doping, boron would be the preferred n-type dopant and lithium would be the preferred p-type dopant. The tendency for large dopants would be to displace the pair of atoms and conventional substitution would not occur. Assignment of a formal valence of +1 to each copper atom would indicate magnesium and, possibly, zinc would be an effective n-dopants. Dopant on the phosphorus atom lattice using sulfur, selenium or telluumca be used for the n-type dopant by conventional substitution.

Controlling the doping and the crystal structure by controlling the stoichiometry by phosphorus, copper and vacuum treatment may prove useful for forming high efficiency structures.

The subsequent processing conditions and the materials selected for adjacent layers must be compatible with this layer. This layer must be thick enough to absorb the incident sunlight and to fabricate separated junctions without the dopant diffusion along the crystallite boundaries extending between them. This thickness will be typically 1–3 microns.

Growth of CuP$_2$ By OMCVD

CuP$_2$ can be grown by OMCVD with a few adjustments. The only reported measurement of the decomposition pressure of this material indicates the atmospheric pressure growth is likely at temperatures as higher than 700° C. and that plasma enhanced growth using microwaves is possible as 650° C. and or up to 550° C. using RF excitation. From this data, the optimal growth can be expected in the range of 400–600° C. at a phosphorus/copper ratio of 10–20 and a total pressure of 1–10 torr.

The species used to transport the copper to the growth site are either copper hexafluoroacetylacetonate or cyclopentadienylcopper triethylphosphine because both are readily available in high purity commercially. The first has the advantage of a higher vapor pressure (preferred) and the second has the advantage of not having oxygen in the molecule. The higher vapor pressure is important because, to achieve target pressures on the order of 1–10, torr requires heating of the lines and chamber to the order of 100° C. For atmospheric pressure growth, hydrogen will be used to raise the total system pressure to near one atmosphere and the plasma enhanced growth will use a hydrogen balance to bring the total system pressure to the 10 to 100 torr range. Microwave excited plasmas are preferred because the reactant partial pressures are so high that total pressure at the higher end of the temperature requires this source. Either excitation could be used at the lower end of the substrates temperature range.

The phosphorus species for use with ZnP$_2$ are also useful for CuP$_2$ and the preferred phosphorus species is white phosphorus. The dopant used will be that organometallic or hydride forms of the elements discussed in the embodiment section for this material.

Magnesium Tetraphosphide Embodiments:

With respect to the preferred embodiment and the selection of alternative materials for layers other than the photovoltaic layer, magnesium tetraphosphide is indistinguishable from the β-ZnP$_2$ embodiments. The principle differences can arise form the amount of unknown information concerning MgP$_4$. It has not been confirmed that MgP$_4$ is a direct bandgap material although the data that is available supports this conclusion. If MgP$_4$ where shown to be indirect, then the layer thickness projected for the preferred embodiment must be increased to 100–250 microns. It has not been verified that MgP$_4$ will be p-type in its intrinsic conductivity although the isostructural material CdP$_4$ and most phosphides of this type have p-type conductivity due to vacancies on the metal lattice. If this material were shown to be n-type then the doping requirements for growth of the layer would change but the preferred embodiment will be as that for ZnP$_2$. Assuming these two unknowns are as predicted, the preferred embodiment of this device is identical to that of ZnP$_2$. Although the value of the bandgap is not unknown, it is within the range that would yield a device with good efficiency provided it is within the projected range of 1–2 eV.

The photovoltaic layer 24 in this preferred embodiment is magnesium tetraphosphide because it is a low cost material which is expected to efficiently absorb the solar spectrum, efficiently transport the photo-generated carriers and can be fabricated with the abrupt p/n and p/p+ junctions needed for an efficient photovoltaic device. The critical p/n diode junction 29 can be formed as a homojunction by a doping transition within the layer during the layer growth or by diffusion from the surface after the layer growth is completed.

The crystal structure is similar to that of CuP$_2$ as far as the phosphorus lattice is concerned but each octahedral space contains only one atom thus normal valence rules apply with an expected formal valence of +2 on the magnesium atom. Thus the conventional dopant useful for ZnP$_2$ are also useful for MgP$_4$. The preferred dopants in this case are lithium for p-type and boron for n-type due to the small size of the magnesium atom.

Controlling the crystal stoichiometry by phosphorus, magnesium, and vacuum treatment may prove useful for forming high efficiency structures.

The subsequent processing conditions and the materials selected for adjacent layers must be compatible with this layer. This layer must be thick enough to absorb the incident sunlight and to fabricate separated junctions without the dopant diffusion along the crystallite boundaries extending between them. This thickness will be typically 1–3 microns, unless it is discovered to be and indirect material as mentioned above.

Growth of $MgP_4$ By OMCVD:

There is little information available on the properties of $MgP_4$ other than crystal structure determination. The decomposition pressure and the optical and electrical property are not accurately known. There are several reasons to project the $MgP_4$ can be grown by OMCVD with a few adjustments. The crystal structure of $MgP_4$ is isostructural with $CuP_2$ with respect to the phosphorus lattice structure. There are planes of continuous nets of interlocking phosphorus rings all composed solely of phosphorus atoms. The metal atoms lie between the planes and bond the planes together. It is known that the decomposition pressures of these materials are dependent upon the properties of the phosphorus lattice structure and that primary vapor species are phosphorus atoms removed from the phosphorus layers. Thus, the decomposition pressure of materials having a similar phosphorus lattice structure would be similar. This is supported by the observation that $MgP_4$ has been grown in a ampule near atmospheric pressure at about 600° C. and $CdP_4$ at about 500° C. Thus, like $CuP_2$, $MgP_4$ should grow under pressure and temperature conditions obtainable by OMCVD. From this analysis the optimal growth condition for $MgP_4$ are projected to be in the range of 400–550° C. at a phosphorus/magnesium ratio of 15–25 and a total pressure of 1–50 torr.

The species used to transport magnesium to the growth site are bis(cyclopentadienyl) magnesium and bis(methylcyclopentadienyl) magnesium where the first is preferred due to better known properties and longer use in as an high purity OMCVD source. The vapor pressure of both of these species or too low for effective use in a room temperature reactor. The optimum pressure of 1–50 torr requires heating of the lines and chamber to the order of 150° C. For atmospheric pressure growth, hydrogen will be used to raise the total system pressure to near one atmosphere and the plasma enhanced growth will us a hydrogen balance to bring the total system pressure to the 10 to 100 torr range. Microwave excited plasmas are necessary because the reactant partial pressures are so high that the total pressure needed would require this plasma excitation source.

The phosphorus species for use with $ZnP_2$ are also useful for $MgP_4$ and the preferred phosphorus species is white phosphorus. The dopant used will be that organometallic or hydride forms of the elements discussed in the embodiment section for this material.

One unique feature of $MgP_4$ to be noted is that a catalyst is necessary to synthesize the material from the elements in sealed ampule at pressures near one atmosphere. The organometallic growth process is expect to provide that catalytic effect without any additional external catalyst because the species arrive at the growth site already bonded to a foreign atom and the bond is switch to a different material during the layer growth. For an additional catalytic effect the plasma enhanced growth method will be used. Because the plasma produces great numbers of free radicals of all species, this is an excellent catalyst. If more catalysis is needed (and this is highly unlikely) then additional species such as chlorine, bromine and methane can be added to the plasma gas to insure sufficient species capable of catalysis. These techniques assure that a low pressure OMCVD growth method is useful for this material. This means that the processing methods and equipment expressed for $ZnP_2$ would also be applicable to $MgP_4$.

Gamma Iron Tetraphosphide Embodiments:

With respect to the preferred embodiment and the selection of alternative materials for layers other than the photovoltaic layer gamma iron tetraphosphide is indistinguishable from the $\beta$-$ZnP_2$ embodiments. The principle differences can arise form the amount of unknown information concerning $\gamma$-$FeP_4$. It has not been confirmed that $\gamma$-$FeP_4$ is a direct bandgap material and the meager data initially available indicates that it may be an indirect gap materials. If $\gamma$-$FeP_4$ where shown to be indirect, then the layer thickness projected for the preferred embodiment must be increased to 100–250 microns. It has not been verified that $\gamma$-$FeP_4$ will be a p-type in it intrinsic conductivity although it has a structure that is closely related to both $MgP_4$ and $CuP_2$ and most phosphides of this type have p-type conductivity due to vacancies on the metal lattice. If $\gamma$-$FeP_4$ proves to be n-type then the preferred embodiment will be identical but the doping requirements during growth of this layer would have to be adjusted. Assuming these two unknowns are as indicated, the preferred embodiment of this device is identical to that of $ZnP_2$ with the layer thickness increased as indicated. The value of the bandgap of the gamma phase is known to be near 1 eV. Thus, the maximum efficiency is reduced and the cost (due to the layer thickness change) is increased. Though less attractive than other materials in this class, the low cost and wide availablity of iron promote its further development.

The photovoltaic layer 24 in this preferred embodiment is gamma iron tetraphosphide because this low cost material which is expected to efficiently absorb the solar spectrum, efficiently transport the photo-generated carriers and can be fabricated with the abrupt p/n and p/p+ junctions needed for an efficient photovoltaic device. The critical p/n diode junction 29 can be formed as a homojunction by a doping transition within the layer during the layer growth or by diffusion from the surface after the layer growth is completed.

The crystal structure is similar to that of $MgP_4$ as far as the phosphorus lattice is concerned but each octahedral space contains only one atom thus normal valence rules apply with an expected formal valence of +2 on the iron atom. Thus the conventional dopants useful for $ZnP_2$ are also useful for $\gamma$-$FeP_4$. The preferred dopants in this case are copper for p-type and aluminum for n-type due to the size of the iron atom.

Controlling the crystal stoichiometry by phosphorus, magnesium, and vacuum treatment may prove useful for forming high efficiency structures.

The subsequent processing conditions and the materials selected for adjacent layers must be compatible with this layer. This layer must be thick enough to absorb the incident sunlight and to fabricate separated junctions without the dopant diffusion along the crystallite boundaries extending between them. This thickness will be typically 1–3 microns, unless it is discovered to be and indirect material as mentioned above.

Growth of $\gamma$-$FeP_4$ By OMCVD:

There is little information available on the properties of $\gamma$-$FeP_4$ other than crystal structure determination. The decomposition pressure and the optical and electrical property are not accurately known. There are several reasons to project the $\gamma$-$FeP_4$ can be grown by OMCVD with a few adjustments. The crystal structure of $\gamma$-$FeP_4$ has a similar structure to $MgP_4$ and $CuP_2$ with respect to the phosphorus lattice structure. These are planes of continuous nets of interlocking phosphorus rings all composed solely of phosphorus atoms. The metal atoms lie between the planes and bond the planes together. The difference is in the pattern by which the rings are arrayed. It is known the decomposition pressure of these materials are dependent upon the properties of the phosphorus lattice structure and that primary vapor species are phosphorus atoms removed from the phosphorus layers. Thus, the decomposition pressure of materials having a similar phosphorus lattice structure would be similar. This is supported by the observations that $MgP_4$ has been grown in a ampule near atmospheric pressure at about 600° C. and $CdP_4$ grew at above 500° C. at a similar pressure. Thus, like $MgP_4$, $\gamma$-$FeP_4$ should grow under pressure and temperature conditions obtainable by OMCVD. From this analysis the optimal growth condition for $\gamma$-$FeP_4$ are projected to be in the range of 400–550° C. at a phosphorus/magnesium ratio of 15–25 and a total pressure of 1–50 torr.

The species used to transport iron to the growth site are bis(cyclopentadienyl) iron and pentacarbonyl iron where the later is preferred due it higher vapor pressure. The vapor pressure of the carbonyl is sufficient for use in a room temperature reactor. The optimum pressure of 1–50 torr would require heating of the lines and chamber to the order of 150° C. if the dienyl were used. For atmospheric pressure growth, hydrogen will be used to raise the total system pressure to near one atmosphere and the plasma enhanced growth will us a hydrogen balance to bring the total system pressure to the 10 to 100 torr range. Microwave excited plasmas are required because the reactant partial pressures are so high that the total pressure needed would require this plasma excitation source.

The phosphorus species for use with $ZnP_2$ are also useful for $\gamma$-$FeP_4$ and the preferred phosphorus species is white phosphorus. The dopant used will be that organometallic or hydride forms of the elements discussed in the embodiment section for this material.

One unique feature of $\gamma$-$FeP_4$ to be noted is that the alpha and beta phase are not useful for solar energy applications because the bandgaps are too low. Thus, the main challenge is to control nucleation of the film to produce only the gamma phase. The can be effected by the substrate, the growth conditions, and by the introduction of alloying agents such as magnesium, copper and (possibly) zinc. Since the crystal structure of the phosphorus lattice of $\gamma$-$FeP_4$ is similar to the $MgP_4$ and $CuP_2$ lattice, the addition of small amounts of these elements would effect the morphology of the $\gamma$-$FeP_4$ layer and would influence the nucleation. This manipulation could promote the desired structure or a influence crystal morphology.

A catalyst would be helpful to promote growth of this higher phosphide phase as it would for $MgP_4$ and could also effect the crystal morphology also. The techniques elaborated for $MgP_4$ apply to $\gamma$-$FeP_4$ also and extend to influencing the crystal morphology.

Mixed Crystal Embodiments:

Since the proposed photovoltaic materials all belong to a class of materials having similar properties, the crystals formed by alloys (continuously variable ratio) or mixed crystals (fixed ratio) made by codeposition of two or more of the proposed materials are useful. It is known that the crystals or alloys formed between two crystals having similar properties have properties intermediate to or similar to the crystals "mixed" to form them. It is also known that the thermodynamic stability and thus resistance to corrosion are also superior in mixed crystals compared to the crystals used to form them. Thus, mixed crystals of the general formulae $Zn_XMg_YCu_{2Z}Fe_UP_{2W}$, where W is nonzero where x,y,z,u,w =0,1,2, . . . (small whole numbers, where at least two of the values X, Y, Z and U are nonzero and where W is nonzero) would be useful for lowcost high-efficiency photovoltaic devices of the preferred embodiment structure. Since any one of the individual compounds can be made using very similar conditions by OMCVD as described, the mixed crystals can also be fabricated directly by this method by simultaneous growth.

$CuP_2$:$ZnP_2$ Solar Cells $Cu_xZn_{1-x}P_2$ mixed crystals will be useful for solar cells because both end compounds are useful and that the mixed crystals could have superior properties to either such as resistance to decomposition, increased radiative recombination lifetime and better optical absorption.

$CuP_2$ and $ZnP_2$ have very different crystal structures and as such do not form homogeneous solid solutions with each other (i.e., x will have a particular invariant value or values). There will be crystals having discrete stoichiometries in the phase space between. Normally, the properties of the mixed crystals will be similar to the pure crystals. But the mixed crystals will have a higher thermodynamic stability than either of the pure phases and thus be more resistant to decomposition than either $ZnP_2$ or $CuP_2$.

The higher thermodynamic stability of these mixed crystals will mean that they have a lower decomposition pressure, require less phosphorus overpressure to stabilize the phase and are thus easier to grow by any means particularly by OMCVD.

Mixed crystal compositions near $CuP_2$ (x=1) would have different crystal structure and properties than mixed crystal near $ZnP_2$ (x=0) or mixed crystals near $CuZnP_4$ (x=0.5) and the superior composition must be determined by experiment. However, any crystals formed within the entire range of composition would by useful for solar cell application.

Resistance to corrosion (a potential problem with both $CuP_2$ and $ZnP_2$) is expected to be improved by mixed crystallization as mixed crystals generally show this behavior. Mixed crystals near $CuP_2$ are expected to have superior lifetimes and slightly better optical absorption. Mixed crystals near $ZnP_2$ are cheaper and easier to grow. Intermediate mixed crystals (x=0.5) may have unique properties not directly apparent in either end compound.

OMCVD growth of all these phases is possible but very different regimes of growth are required.

$ZnP_2$:$MgP_4$ Solar Cells

A similar reason to the usefulness of $CuP_2$:$ZnP_2$ solar cells applies to $ZnP_2$:$MgP_4$ mixed crystals for solar cells. They will have a discrete stoichiometry. They will be similar to the pure phases and therefore useful for solar cell application. They will have improved thermodynamic stability and thus increase resistance to decomposition. They could provide superior performance as thin film solar cells.

The higher thermodynamic stability of these mixed crystals will mean that they have a lower decomposition pressure, require less phosphorus overpressure to stabilize the phase and are thus easier to growth by any means, particularly by OMCVD.

There is no mention of any Zn/Mg/P crystal in the literature having the "higher" stoichiometry (where there is more phosphorus atoms than the sum of other metal atoms). In particular crystals where the phosphorus stoichiometry is equal to or greater than 2 times the sum of the other metal atoms.

$CuP_2$:$MgP_4$ Solar Cells

A similar reason to the usefulness of $CuP_2$:$ZnP_2$ solar cells applies to $CuP_2$:$MgP_4$ mixed crystals for solar cells. They will have a discrete stoichiometry. They will be similar to the pure phases and therefore useful for solar cell application. The will have improved thermodynamic stability and thus increase resistance to decomposition. They could provide superior performance as thin film solar cells.

The higher thermodynamic stability of these mixed crystals will mean that they have a lower decomposition pressure, require less phosphorus overpressure to stabilize the phase and are thus easier to grow by any means particularly by OMCVD.

Because the crystal structure of $CuP_2$ is closer to that of $MgP_4$ than $ZnP_2$, with it is expected that these mixed crystal will be more like the pure phase than would be expected from "$ZnCuP_2$".

$FeP_4$ Heterojunction Device

Alpha $FeP_4$ (0.32 eV) has a very similar crystal structure to gamma $FeP_4$ (1 eV). The primary difference is in the stacking of the layers.

It is possible to create a heterojunction solar cell in this system by depositing the gamma phase on a substrate of the alpha phase and doping each phase to produce an electrical junction at their interface. The advantage of the cell is that the two different material each absorb a different segment of the solar spectrum offering a higher current generation efficiency than would a single absorber. This device would be more useful as a broad-band infrared absorber than for a solar cell because the energy gaps are no ideal for the solar spectrum.

$Mg_xFe_{1-x}P_4$ Solar Cells $MgP_4$ and $FeP_4$ also have similar crystal structures. The difference is in the stacking orders.

Mixed crystals are very likely. The properties of these will reflect the pure crystal properties. Thus, mixed crystals near $MgP_4$ are likely to useful for solar applications because the stacking sequence of $MgP_4$ is very similar to that of gamma (solar) $FeP_4$. Mixed crystals near $FeP_4$ will have indeterminate properties because any of several $FeP_4$ stacking orders may be produced. Thus, these high $FeP_4$ content crystals would require Mg to catalyze a gamma type crystal phase to be of interest to the solar application.

I Claim:

1. A photovoltaic cell comprising:
   (a) a thin film photovoltaic generating layer, having a pn junction within which photogenerated free carriers are generated by incident light;
   (b) a back conductor in electrical contact with said photovoltaic layer; and
   (c) a front transparent conductor in electrical contact with said photovoltaic layer;
   wherein said thin film photovoltaic generating layer is selected from the class consisting of: β-zinc diphosphide; copper diphosphide; magnesium tetraphosphide; γ-iron tetraphosphide; and a mixed crystal of composition $Zn_XMg_YCu_{2Z}Fe_UP_{2W}$, wherein W and at least two of the parameters X, Y, Z and U are nonzero, where X, Y, Z, U and W are small whole numbers, whereby said photovoltaic cell exhibits a greatly improved average cost per Watt-Hour over a useful life of this photovoltaic cell.

2. A photovoltaic cell as in claim 1 wherein said thin film photovoltaic generating layer has a thickness on the order of 1–3 microns, whereby this layer absorbs a high fraction of incident sunlight and yet has surfaces that are sufficiently separated to avoid significant dopant diffusion along crystallite boundaries extending between these surfaces.

3. A photovoltaic cell as in claim 1 wherein said pn junction is a homojunction buried sufficiently below a front surface of said thin film photovoltaic generating layer that degradation of cell photovoltaic conversion efficiency by outdiffusion from this layer or by indiffusion of ambient chemicals is substantially eliminated.

4. A photovoltaic cell as in claim 1 wherein said pn junction is a heterojunction.

5. A photovoltaic cell as in claim 4 wherein said photovoltaic layer is comprised of a layer of β-$ZnP_2$ and a layer of $ZnAs_2$ and wherein said pn junction is formed at an interface between the $ZnP_2$ and $ZnAs_2$ layers.

6. A photovoltaic cell as in claim 1 further comprising a passivation layer between an exterior surface of said cell and a front surface of said thin film photovoltaic generating layer, where incident light passes to said photovoltaic generating layer.

7. A photovoltaic cell as in claim 6 wherein said passivation layer is selected from the class consisting of: BP, $B_6P$, $AlPO_4$, $BPO_4$ and $ZnPO_X$.

8. A photovoltaic cell as in claim 7 wherein said passivation layer is BP, whereby said passivation layer is particularly hard and inert and can be grown from vapor in either p-doped or n-doped compositions.

9. A photovoltaic cell as in claim 8 wherein said thin film photovoltaic layer is β-$ZnP_2$, whereby said BP passivation layer is physically and chemically compatible with said β-$ZnP_2$ photovoltaic layer.

10. A photovoltaic cell as in claim 9 wherein said β-$ZnP_2$ photovoltaic layer and said BP passivation layer are in direct contact thereby forming said pn junction at a heterojunction between these two layers.

11. A photovoltaic cell as in claim 10 wherein said β-$ZnP_2$ photovoltaic layer is doped n-type with boron dopant and said BP is doped p-type with Zn dopant, thereby utilizing the fact that boron is an n-dopant in β-$ZnP_2$ and that Zn is a p-dopant in BP.

12. A photovoltaic cell as in claim 1 further comprising on a front surface of said β-$ZnP_2$ layer, a layer of degenerately-doped zinc phosphate ($ZnPO_X$), whereby this zinc phosphate layer functions as a passivation layer that prevents transport of atmospheric oxygen and moisture to said diode junction, that prevents the transport of the initial decomposition products from said β-$ZnP_2$ layer and that functions as a transparent conductor.

13. A photovoltaic cell as in claim 1 wherein said thin film photovoltaic generating layer is β-$ZnP_2$.

14. A photovoltaic cell as in claim 13 wherein said β-$ZnP_2$ layer is doped with Cu, which exhibits a low mobility in the β-$ZnP_2$ layer.

15. A photovoltaic cell as in claim 13 wherein said front conductor is degenerately n-doped boron phosphide (BP), which thereby functions as a transparent conductor as well as a passivation layer.

16. A photovoltaic cell as in claim 13 wherein said front conductor is of a material selected from the class consisting of tin oxide and indium tin oxide.

17. A photovoltaic cell as in claim 13 wherein said front conductor is zinc oxide.

18. A photovoltaic cell as in claim 13 wherein said front conductor is of a material selected from the class consisting of doped aluminum phosphate, zinc phosphate, boron phosphide and antimony tin oxide.

19. A photovoltaic cell as in claim 13 wherein said front conductor is zinc metaphosphate and which functions as a transparent conductor, whereby a very stable interface is formed between said β-zinc diphosphide layer and said zinc metaphosphate layer because the ratio of zinc to phosphorus is the same in both layers.

20. A photovoltaic cell as in claim 13 wherein said front conductor is polycrystalline zinc orthophosphate, which is advantageous in functioning as a transparent conductor, in being stable and in being easy to grow on $ZnP_2$.

21. A photovoltaic cell as in claim 1 further comprising an antireflection layer on said front conductor through which incident light is to pass to said photovoltaic layer.

22. A photovoltaic cell as in claim 21 wherein said antireflection layer is $B_6P$, whereby this antireflection layer is particularly hard and inert and exhibits a low absorption for ultraviolet light.

23. A photovoltaic cell as in claim 1 wherein said front conductor is augmented by a grid conductor.

24. A photovoltaic cell as in claim 1 wherein said back conductor is made of a material selected from the class consisting of copper, aluminum, molybdenum and any alloy containing predominantly one or more of these three materials, whereby this layer forms a low resistance contact to the photovoltaic layer.

25. A photovoltaic cell as in claim 1 wherein said back conductor is copper.

26. A photovoltaic cell as in claim 1 wherein said back conductor is a copper alloy selected from the class consisting of: brass, phosphocopper alloy, cupronickel and bronze.

27. A photovoltaic cell as in claim 1 wherein said back conductor is thick enough that it also functions as a substrate, thereby avoiding the need to form a separate substrate layer.

28. A photovoltaic cell as in claim 27 wherein said substrate is a foil selected from the class consisting of: copper, aluminum, molybdenum and any alloy containing predominantly one or more of these three materials.

29. A photovoltaic cell as in claim 27 wherein said back substrate has a thickness in the range 40–100 microns.

30. A photovoltaic cell as in claim 1, further comprising between said photovoltaic layer and said back conductor an interlayer selected from the class consisting of molybdenum, copper, silver, lithium, gold, platinum, palladium, titanium, vanadium, chromium, manganese, tungsten, tantalum, iron, copper and nickel.

31. A photovoltaic cell as in claim 1 in which a p-type conductivity of said photovoltaic layer has been produced by forming this layer with a phosphorus-rich stoichiometry.

32. A photovoltaic cell as in claim 1 in which an n-type conductivity of said photovoltaic layer has been produced by forming this layer with a metal-rich stoichiometry to produce an n-type layer.

33. A photovoltaic cell as in claim 1 wherein said thin film photovoltaic layer was deposited by a chemical vapor deposition (CVD) process, whereby a high quality thin film is produced.

34. A photovoltaic cell as in claim 33, wherein said CVD process is an organometallic CVD process, whereby a high quality thin film photovoltaic layer is produced.

35. A photovoltaic cell as in claim 34 wherein said photovoltaic layer was deposited in a plasma-enhanced environment, thereby enabling deposition at reduced temperatures, making this process suitable for deposition onto high temperature stable plastic substrates.

36. A photovoltaic cell as in claim 33, wherein said CVD process is a microwave plasma-enhanced, CVD process, at a total chamber pressure of 1–100 torr, whereby it can be operated at temperatures that are low enough to enable a high temperature, stable to be used as a substrate.

37. A photovoltaic cell as in claim 33 wherein said CVD process is operated at a near-atmospheric pressure, thereby enabling this process to form said photovoltaic layer on a substrate that is fed through an open-ended CVD chamber, whereby a high volume fabrication process can be implemented.

38. A photovoltaic cell as in claim 33 wherein process parameters of said CVD process are selected to lie in a single phase process region, whereby a high quality photovoltaic layer can be formed.

39. A photovoltaic cell as in claim 33 wherein said CVD process uses white phosphorus as a phosphorus source, whereby this low-cost form of phosphorus produces very high quality photovoltaic films.

40. A photovoltaic cell as in claim 1, further comprising a back surface field formed near an interface between said back conductor and said photovoltaic layer.

41. A photovoltaic cell comprising:
(a) a thin film photvoltaic generating layer, having a pn junction within which photogenerated free carries can be generated by incident light;
(b) a back conductor in electrical contact with a first surface of said photovoltaic layer; and
(c) a front transparent conductor in electrical contact with a second surface of said photovoltaic layer,
wherein said thin film photovoltaic generating layer is $CuP_2$, which is a material that uniquely has both direct and indirect bandgap states with high solar response.

42. A photovoltaic cell comprising:
(a) a thin film photvoltaic generating layer, having a pn junction within which photogenerated free carries can be generated by incident light;
(b) a back conductor in electrical contact with a first surface of said photovoltaic layer; and
(c) a front transparent conductor in electrical contact with a second surface of said photovoltaic layer,
wherein said thin film photovoltaic layer is $MgP_4$.

43. A photovoltaic cell comprising:
(a) a thin film photvoltaic generating layer, having a pn junction within which photogenerated free carries can be generated by incident light;
(b) a back conductor in electrical contact with a first surface of said photovoltaic layer; and
(c) a front transparent conductor in electrical contact with a second surface of said photovoltaic layer,
wherein said thin film photovoltaic layer is $\gamma\text{-}FeP_4$.

44. A photovoltaic cell as in claim 35 further comprising on a photovoltaic layer of said $\gamma\text{-}FeP_4$ layer and a layer of $\alpha\text{-}FeP_4$, thereby forming a heterojunction pn junction at an interface between these two layers.

45. A photovoltaic cell comprising:
(a) a thin film photvoltaic generating layer, having a pn junction within which photogenerated free carries can be generated by incident light;
(b) a back conductor in electrical contact with a first surface of said photovoltaic layer; and
(c) a front transparent conductor in electrical contact with a second surface of said photovoltaic layer,
wherein said thin film photovoltaic layer is a mixed crystal of composition $Zn_XMg_YCu_{2Z}Fe_UP_{2W}$, where X, Y, Z, U and W are small integers within W and at least two of the integers X, Y, Z and U are nonzero.

46. A photovoltaic cell comprising:
(a) a film photovoltaic generating layer of $\gamma FeP_4$, having a pn junction within which photogenerated free carriers are generated by incident light;
(b) a back conductor in electrical contact with said photovoltaic layer; and
(c) a transparent front conductor in electrical contact with said photovoltaic layer.

47. A photovoltaic cell comprising:
(a) a film photovoltaic generating layer of $MgP_4$, having a pn junction within which photogenerated free carriers are generated by incident light;
(b) a back conductor in electrical contact with said photovoltaic layer; and
(c) a transparent front conductor in electrical contact with said photovoltaic layer.

* * * * *